United States Patent [19]
Sato et al.

[11] Patent Number: 6,143,628
[45] Date of Patent: Nov. 7, 2000

[54] SEMICONDUCTOR SUBSTRATE AND METHOD OF MANUFACTURING THE SAME

[75] Inventors: Nobuhiko Sato, Sagamihara; Takao Yonehara, Atsugi; Kiyofumi Sakaguchi, Yokohama, all of Japan

[73] Assignee: Canon Kabushiki Kaisha, Tokyo, Japan

[21] Appl. No.: 09/047,326

[22] Filed: Mar. 25, 1998

[30] Foreign Application Priority Data

Mar. 27, 1997 [JP] Japan ................................. 9-075545

[51] Int. Cl.$^7$ ............................. H01L 21/30; H01L 21/46
[52] U.S. Cl. ......................... 438/455; 438/409; 438/458; 438/459
[58] Field of Search .................................. 438/455, 406, 438/409, 458, 459

[56] References Cited

U.S. PATENT DOCUMENTS

| | | |
|---|---|---|
| 5,492,859 | 2/1996 | Sakaguchi et al. . |
| 5,854,123 | 12/1998 | Sato et al. . |
| 5,856,229 | 1/1999 | Sakaguchi et al. . |

FOREIGN PATENT DOCUMENTS

| | | |
|---|---|---|
| 0 553 852 | 8/1993 | European Pat. Off. . |
| 0 755 068 | 1/1997 | European Pat. Off. . |
| 0 767 486 | 4/1997 | European Pat. Off. . |
| 0 793 263 | 9/1997 | European Pat. Off. . |
| 0 797 258 | 9/1997 | European Pat. Off. . |
| 0 867 919 | 9/1998 | European Pat. Off. . |
| 5-211128 | 8/1993 | Japan . |
| 7-302889 | 11/1995 | Japan . |
| 8-213645 | 8/1996 | Japan . |

OTHER PUBLICATIONS

C. Harendt, "Silicon on Insulator Material by Wafer Bonding", J. Elect. Mater., vol. 20, No. 3, pp. 267–277 (1991).

C.E. Hunt, "Thinning of Bonded Wafers: Etch–Stop Approaches", Proc. of 1st Intl. Symp. on Semiconductor Wafer Bonding, pp. 165–173 (1991).

A. Uhlir, "Electolytic Shaping of Germanium and Silicon", Bell Sys. Tech. J., vol. 35, pp. 333–347 (1956).

T. Unagami, "Formation Mechanism of Porous Silicon Layer by Anodization in HF Solution", J. Electrochem. Soc., vol. 127, No. 2, pp. 476–483 (1980).

V. Raineri, "Silicon–on–insulator produced by helium implantation and thermal oxidation", Appl. Phys. Lett. vol. 66, No. 26, pp. 3654–3656 (1995).

T. Yonehara, "Epitaxial layer transfer by bond and etch back of porous Si", Appl. Phys. Lett., vol. 64, No. 16, pp. 2108–2110 (1994).

K. Imai, "A New Dielectric Isolation Method Using Porous Silicon", Solid State Elect., vol. 24, pp. 159–164 (1980).

K. Imai, "Crystalline Quality of Silicon Layer Formed by FIPOS Technology", J. Cryst. Grow., vol. 63, pp. 547–553 (1983).

A. VanVeen, "Helium–Induced Porous Layer Formation in Silicon", Mat. Res. Soc. Symp. Proc., vol. 107, pp. 449–454 (1988).

*Primary Examiner*—Kevin M. Picardat
*Assistant Examiner*—D. M. Collins
*Attorney, Agent, or Firm*—Fitzpatrick, Cella, Harper & Scinto

[57] ABSTRACT

A manufacturing method excellent in controllability, productivity and economics of a high-quality SOI wafer and a wafer manufactured by that method are provided. After wafer bonding, separation is made on an interface of a high porosity layer in a porous region including a low porosity layer and the high porosity layer in a surface formed on a main surface side of a first Si substrate 2 to transfer a non-porous layer onto a second substrate. After separation at the high porosity layer, a residual low porosity thin layer is made non-porous by a smoothing process such as hydrogen annealing without using selective etching.

82 Claims, 6 Drawing Sheets

SEMICONDUCTOR SUBSTRATE AND METHOD OF MANUFACTURING THE SAME

BACKGROUND OF THE INVENTION

1. Field of the Invention

The present invention relates to a method of manufacturing a semiconductor substrate, and more particularly to a method of manufacturing a semiconductor substrate suitable for the formation of an electronic device or an integrated circuit provided on a layer of a single crystal semiconductor formed on a dielectric isolation layer or an insulator or provided on a single crystal compound semiconductor formed on an Si substrate.

2. Related Background Art

The formation of a single crystal Si semiconductor layer on an insulator is widely known as a Semiconductor On Insulator (SOI) technique, and much research has been conducted regarding the SOI technique because a device employing the SOI technique provides various advantages that cannot be attained by a bulk Si substrate from which a normal Si integrated circuit is fabricated. That is, the use of the SOI technique provides, for example, the following advantages:

1. Dielectric isolation is facilitated, and high integration is enabled.
2. Excellent radiation resistance is achieved.
3. Stray capacity is reduced to enable high-speed operation.
4. Well processing can be omitted.
5. Latch-up can be prevented.
6. A fully depleted field effect transistor is enabled by making a film thin. They are disclosed in more detail, for example, in Special Issue: "Single-crystal silicon on non-single-crystal insulators"; edited by G. W. Cullen, Journal of Crystal Growth, Vol. 63, No. 3, 429–590 (1983).

Further, in recent years, it has been frequently reported that an SOI substrate is a substrate that realizes an increase in operation speed of a MOSFET and a reduction in power consumption thereof (IEEE SOI conference 1994). Also, the use of the SOI structure simplifies the element isolation process more than where an element is formed on the bulk Si wafer. This is because an insulating layer is formed on a lower portion of the element, and, as a result, a device processing process is shortened. In other words, it is expected that the wafer costs and the process costs are reduced in total in comparison with the MOSFET or IC formed on the bulk Si, while achieving high performance characteristics.

In particular, the fully depleted MOSFET is expected to increase operation speed and to reduce power consumption due to an improvement of driving force. A threshold voltage (Vth) of the MOSFET is generally determined according to the density of impurities in a channel section, but in a fully depleted MOSFET using the SOI, a thickness of the depletion layer is affected by a thickness of the SOI. Therefore, in order to manufacture a large-scaled integrated circuit with an excellent yield, a great demand has arisen for the thickness of the SOI film to be uniform.

Also, the devices on a compound semiconductor have high performance which cannot be obtained by Si, for example, features such as a high-speed operation or light emission. At the present, those devices are almost formed in an epitaxially grown layer formed on a compound semiconductor substrate made of GaAs. However, the compound semiconductor substrate suffers from such problems that the substrate is expensive and low in mechanical strength and that manufacturing of a large-area wafer is difficult.

From the above viewpoints, an attempt has been made to allow a compound semiconductor to epitaxially grow on the Si wafer which is inexpensive and high in mechanical strength and from which a large-area wafer can be manufactured.

Research in the formation of the SOI substrate has been extensively conducted since the 1970's. Initially, a method in which single crystal Si is allowed to hetero-epitaxially grow on a sapphire substrate which is an insulator (SOS: Sapphire on Silicon), a method of forming an SOI structure through dielectric isolation by porous oxidized Si (FIPOS: Fully Isolation by Porous Oxidized Silicon), and an oxygen ion implantation method have been extensively studied.

The FIPOS method is a method in which an N-type Si layer is formed on a surface of a P-type Si single crystal substrate in the form of an island by implanting proton ions (Imai et al., J. Crystal Growth, Vol. 63, 547(1983)) or by epitaxial growth and patterning. Only a P-type Si substrate is made porous through an anodization method in an HF solution so as to surround the Si island from the surface. Thereafter the N-type Si island is dielectrically isolated by accelerating oxidation. The degree of device design freedom may be restricted because the Si region isolated is determined prior to device processing.

The oxygen ion implantation method is directed to a method which is called "SIMOX" initially reported by K. Izumi. In the method, after oxygen ions of about $10^{17}$ to $10^{18}/cm^2$ are implanted into a Si wafer, the Si wafer is annealed at a high temperature of about 1,320° C. in an argon/oxygen atmosphere. As a result, implanted oxygen ions mainly having a depth corresponding to a projection range (Rp) of ion implantation are bonded to Si to form a Si oxide layer. At this time, the Si layer which is made amorphous by implantation of oxygen ions on an upper portion of the Si oxide layer is also recrystallized to form a single crystal Si layer. Although the number of defects contained in the Si layer of the surface is conventionally large, that is, $10^5/cm^2$, it has been successfully reduced to about $10^2/cm^2$ by setting the amount of implanted oxygen to about $4 \times 10^{17}/cm^2$. However, because the ranges of the implantation energy and the amount of implantation by which the quality of the Si oxide film, the crystallinity of the surface Si layer, etc. can be maintained are narrow, the thicknesses of the surface Si layer and the buried oxide Si layer (BOX: Buried Oxide) are limited to specific values. In order to obtain the surface Si layer having a desired thickness, it is necessary to conduct sacrificial oxidation or epitaxial growth. In this case, thickness distribution suffers such that thickness uniformity deteriorates as a result of the superimposition of the deterioration of those processes.

Also, it has been reported that a residual Si region in a silicon oxide which is called "pipe" exists in the BOX. A foreign matter such as dust during implanting has been considered as one cause. On a portion where the pipe exists, the device characteristic is deteriorated by leakage between an active layer and a support member.

Because the ion implantation of the SIMOX is more in the amount of implantation than the ion implantation used in a normal semiconductor process as described above, a period of time when ion is implanted is long even with an exclusive apparatus being developed. Because the ion implantation is conducted by raster-scanning an ion beam having a predetermined current amount or expanding an ion beam, it is presumed that the implantation period increases with an increased area of the wafer. Also, it has been pointed out that a high-temperature heat treatment on the large-area wafer causes a more sever slip problem due to the distribution of the temperature within the wafer more. In the SIMOX, since it is essential to conduct a heat treatment at a high temperature which is not normally used in the Si semiconductor process, such as 1300° C. or higher, there is a fear that the problems to be overcome such as the device development, metal contamination or slip become more pronounced.

Also, apart from the above-described conventional SOI forming method, in the recent years, attention has been paid to a method in which a Si single crystal substrate is bonded to another Si single crystal substrate thermally oxidized with a heat treatment or an adhesive to form an SOI structure. This method requires a process of making an active layer uniformly thin for a device. In other words, Si single crystal substrate several hundreds $\mu$m in thickness is required to be made thin on the order of $\mu$m or less. The thinning process is made by three kinds of methods stated below.

1. Thinning by polishing;
2. Thinning by local plasma etching; and
3. Thinning by selective etching.

In the method 1, it is difficult to uniformly thin the substrate. In particular, thinning of sub $\mu$m causes the fluctuation of several tens %, and this thinning suffers from a severe problem. Also, as the diameter of the wafer is increased, difficulty is increased.

In the method 2, after the substrate is made thin by polishing in the method 1 up to about 1 to 3 $\mu$m in advance, the distribution of the film thickness is measured over the entire surface at multi-points, and plasma using $SF_6$ of several mm in diameter is scanned on the basis of the measured distribution of the film thickness so that etching is conducted while the distribution of the film thickness is being corrected, thereby thinning the substrate to a desired thickness. It has been reported that this method enables the distribution of the film thickness to be adjusted to about ±10 nm. However, if a particle exists on the substrate at the time of plasma etching, because the particle functions as an etching mask, a projection is formed on the substrate.

Because the surface of the substrate is rough immediately after the substrate is plasma-etched, touch polishing is required after the plasma etching has been completed. However, since the amount of polishing is time-controlled, the control of final film thickness and the deterioration of the distribution of the thickness by polishing has been noted. Also, in a polishing process, since an abrasive powder such as colloidal silica directly polishes the surface that will form an active layer, there are fears that a damaged layer is formed by polishing and that machining distortion is introduced. Further, in the case where the area of the wafer is enlarged, there is a fear that through-put is remarkably reduced because the plasma etching period increases in proportion to an increase of the wafer area.

The method 3 is directed to a method in which a film structure which can be selectively etched is made on the substrate to be made thin in advance. For example, a $P^+Si$ thin layer and a P-type Si thin layer each containing boron of $10^{19}/cm^3$ or more are superposed onto a P-type substrate through a method such as epitaxial growth to form a first substrate. After this substrate is bonded to a second substrate through an insulating layer such as an oxide film, a back surface of the first substrate is thinned by grinding or polishing in advance. Thereafter, the P-type layer is selectively etched to expose the $P^+$ layer, and also the $P^+$ layer is selectively etched to expose the P-type layer, thus completing the SOI structure. This method is disclosed in more detail by the report of Maszara (W. P. Maszara, J. Electrochem. Soc., Vol. 138, 341(1991)).

It is said that the selective etching is effective in a uniform thin film formation, but the selective etching suffers from the following problems.

The selective ratio of etching is insufficient such that it is about $10^2$ at the maximum.

Because the surface property after being etched is poor, touch polishing is required after the etching. However, as a result, the film thickness is reduced, and the uniformity of the film thickness is liable to be deteriorated. In particular, the amount of polishing is managed by time, but because the fluctuation of a polishing rate is large, it is difficult to control the amount of polishing. Therefore, this problem becomes severe particularly when a very-thin SOI layer such as 100 nm is formed.

Because ion implantation, epitaxial growth or heteroepitaxial growth on a high-concentration B doped Si layer is used, the crystallinity of the SOI layer is low. Also, the surface property of the surface to be bonded is inferior to a normal Si wafer.

The above description is reported by C. Harendt, et al., J. Elect. Mater. Vol. 20, 267 (1991), H. Baumgart, et al., Proceeding of the 1st International Symposium on Semiconductor Wafer Bonding: Science, Technology and Applications, (The Electrochemical Society) Vol. 92-7, 375, and C. E. Hunt, et al., Proceeding of the 1st International Symposium on Semiconductor Wafer Bonding: Science, Technology and Applications, (The Electrochemical Society) Vol. 92-7, 165.

Also, the selectivity of the selective etching largely depends on a difference in concentration of impurities such as boron and the abruptness of the profile in its depth direction. Therefore, if bonding annealing at a high temperature for enhancing a bonding strength or epitaxial growth at a high temperature for improving crystallinity is conducted, the distribution of impurity concentration in the depth direction is expanded to thereby deteriorate the selectivity of etching. In other words, it is difficult to improve all of the selective ratio of the etching, the crystallinity and bonding strength together.

In the recent years, Yonehara, et al. have reported a bonding SOI which solves the above problems, is excellent in the uniformity of the film thickness and crystallinity, and can be batch-processed (T. Yonehara, et al., Appl. Phys. Letter Vol. 64, 2108 (1994)). This method employs a porous layer 32 of an Si substrate 31 as a material of selective etching. After a non-porous single crystal Si layer 33 is allowed to epitaxially grow on the porous layer, it is bonded to a second substrate 34 through a Si oxide layer (insulating film) 35 (FIG. 5A). A first substrate is made thin from its back surface through a grinding method or the like so that the porous Si is exposed over the entire surface of the substrate (FIG. 5B). The exposed porous Si is etched with a selective etchant such as KOH or $HF+H_2O_2$ so as to be removed (FIG. 5C). At this time, since the etching selective ratio of the porous Si to the bulk Si (non-porous single crystal Si) can be made as high as 100,000, the non-porous single crystal Si layer that has grown on the porous Si in advance remains on the second substrate without substantially reducing its thickness, thereby making possible the formation of an SOI substrate. Therefore, uniformity of the thickness of the SOI is determined substantially during epitaxial growth. Since a CVD device used in a normal semiconductor process can be employed for epitaxial growth, according to the report (SSDM95) by Sato, et al., it is realized that its uniformity is, for example, within 100 nm±2%. Also, it is reported that the crystallinity of the epitaxial Si layer is also excellent and $3.5 \times 10^2 / cm^2$.

The porous Si has been discovered by Uhlir, et al., during study of electrolytic polishing of semiconductor (A. Uhlir, Bell Syst. Tech. J., Vol. 35 333(1956)). The porous Si can be formed by subjecting a Si substrate to anodization in an HF solution. The porous Si has micro-pores like sponge formed by electrolyte etching in bulk Si, and has pores about several nm in diameter, for example, with a density of about $10^{11}/cm^2$, depending on the conditions of anodization and the specific resistance of Si.

Unagami, et al., have studied dissolution reaction of Si in anodization and reported that positive holes are required for anodic reaction of Si in an HF solution, and its reaction is made as follows (T. Unagami, J. Elecrochem. Soc., Vol. 127, 476 (1980)).

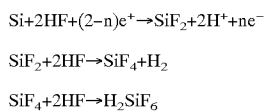

or

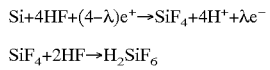

where $e^+$ and $e^-$ represent a positive hole and an electron, respectively. Also, n and λ represent the number of positive holes necessary for dissolving Si of one atom, respectively, and in the case where a condition of n>2 or λ>4 is satisfied, the porous Si is formed.

From the above viewpoints, the P-type Si where positive holes exist is made porous, but the N-type Si is not made porous. The selectivity at the time of porous structure formation has been proved by Nagano, et al., and Imai (Nagano, Nakajima, Yasuno, Onaka, Kajiwara, Electronic communication society technical research report, Vol.79, SSD79-9549(1979) and (K. Imai, Solid-state Electronics, Vol.24, 159(1981)).

In the conventional method, because the selectivity of etching is determined by a difference in impurity concentration and a profile in its depth direction, a heat treatment temperature which causes the distribution of concentration to be expanded (bonding, epitaxial growth, oxidization, etc.) is largely limited to about 800° C. or below. On the other hand, in the etching of this method, it has been reported that because an etching rate is determined according to a structural difference between the porous structure and the bulk, the limitation of the heat treatment temperature is small to such an extent that the heat treatment at about 1,180° C. is enabled. For example, there has been known that a heat treatment after bonding wafers to each other enhances an adhesive strength between the wafers and reduces the number and size of voids occurring on the bonding interface. Also, in the etching on the basis of a structural difference, even if a particle stuck onto the porous Si exists, the particle does not adversely affect the uniformity of the film thickness.

Also, in general, a thin film Si layer deposited on a light transmitting substrate represented by glass becomes an amorphous layer or a polycrystal layer at the best because the disorder of the crystal structure of the substrate is reflected, thereby disenabling the manufacture of a high-performance device. This is because the crystal structure of the substrate is amorphous, and even if a Si layer is merely deposited on the substrate, a high-quality single crystal layer cannot be obtained.

However, the semiconductor substrate using bonded wafers always requires two wafers, and a large portion of one of those wafers is uselessly removed by polishing, etching, etc., and abandoned, which causes not only the costs to increase, but also the finite resource in the earth to be wasted.

In order to utilize the features of the SOI using the bonded wafers, a method has been desired in which an SOI substrate having a satisfactory quality is manufactured with a high reproducibility, resources are saved by reusing the wafers, etc., and cost reduction is realized.

A method of reusing a first substrate which is wasted in the bonding method has recently been reported by Sakaguchi, et al. (Japanese Patent Application Laid-Open No. 7-302889).

They have applied the following method instead of a process in which the first substrate is ground from the back surface thereof, and a porous Si is exposed by thinning the first substrate by etching or the like in the method of bonding and conducting etch-back using the above-described porous Si.

After a surface layer of a first Si substrate 41 is made porous to form a porous layer 42, a single crystal Si layer 43 is formed thereon, and the single crystal Si layer 43 is bonded to a main surface of a second Si substrate 44 different from the first Si substrate 41 through an insulating layer 45 (FIG. 6A). Thereafter, the bonded wafers are divided at the porous layer (FIG. 6B), and the porous Si layer exposed from the surface of the second Si substrate is removed by selective etching, thereby forming an SOI substrate (FIG. 6C). The bonded wafers are split within the porous Si layer through one of the following techniques:

a sufficient tensile force or pressure is uniformly applied perpendicularly toward the in-plane of the bonded wafers;

a wave energy such as an ultrasonic wave is applied;

the porous layer is allowed to appear on the wafer edge surface, the porous Si is etched to some degree, and a member sharp as a razor blade is inserted into the etched porous Si;

the porous layer is allowed to appear on the wafer edge surface, and after a liquid such as water is permitted to permeate the porous Si, the entire bonded wafers are heated or cooled to inflate the liquid; or a force is exerted on the first (or second) substrate horizontally to the second (or first) substrate.

Those techniques are based on the consideration that the porous Si is sufficiently weaker than the bulk Si although the mechanical strength of the porous Si, depends on the porosity. For example, it can be presumed that if the porosity degree is 50%, the mechanical strength of the porous Si is half that of the bulk. In other words, if a compressive force, a tensile force or a shearing force is applied to the bonded wafers, the porous Si layer is first destroyed. Also, as the porosity is increased, the porous layer can be destroyed with a weaker force.

In this specification, porosity is defined as a ratio of the volume of total pores to the material of the porous layer in the volume of the porous layer.

However, in a method disclosed in Japanese Patent Application Laid-Open No. 7-302889, a position of the separation in the porous layer in the thickness direction cannot be defined, and a location where separation occurs in the layer is different for each of the wafers, thereby lowering the yield. Furthermore, a thickness of the remaining portions of the porous Si layer after being separated in the wafer surface is dispersed, and even if a high selective etching is employed, the yield may be lowered in order to satisfy the specification of the SOI for high uniformity of the film thickness.

Also, Japanese Patent Application Laid-Open No. 8-213645 discloses a method of separating the bonded wafers at the porous layer, but does not disclose the layer-like structure of the porous layer. Apart from this publication, Proceedings of Applied Physics Society, autumn of 1996, p. 673 by Tayanaka discloses that a current is varied during a process to manufacture a porous Si.

Japanese Patent Application Laid-Open No. 8-213645 discloses that the separation is made from any position in the separation layer, in other words, that a position where separation is made cannot be defined. In this case, the thickness of the remaining porous Si layer within the wafer surface is dispersed, and even if the porous Si is removed by etching, if the rate of etching to the active layer (device layer) which is a non-porous single crystal layer is not 0 (zero), the active layer is somewhat etched to cause the fluctuation of the in-plane of the thickness. Alternatively, even if the substrate is used in a state where the remaining porous Si layer exists, a surface step depending on the separation position remains. Also, even in the above method described in the Proceedings of Applied Physics Society, autumn of 1996, p. 673 by Tayanaka, the separation occurs in the center of the porous Si with the result that the portions of the porous Si layers remaining on both of the substrates must be removed.

It has been considered that the process of etching the porous layer remaining on the surface of the layer transferred onto the second substrate is essential in order to manufacture a high-quality bonded SOI substrate. However, a period required for the etching process is elongated more as the thickness of the remaining porous layer is thick, and also processes such as carrying in/out the substrates to the etching apparatus, management of the etching apparatus or etchant, or cleaning after etching, which are accompanied with the etching process, are required. Therefore, if the etching process can be omitted, a period of time required for manufacturing the SOI substrate can be greatly reduced. Even if the conventional etching process cannot be fully omitted, if the etching period can be greatly reduced, the period of time required for manufacturing the SOI substrate is shortened, thereby providing the SOI substrate inexpensively.

SUMMARY OF THE INVENTION

The present invention has been made to solve the above problems with the prior art, and therefore an object of the present invention is to provide a method of manufacturing a semiconductor substrate which is capable of omitting or shortening a selective etching process of a porous layer.

Another object of the present invention is to provide a method of manufacturing a semiconductor substrate represented by a high-quality SOI substrate inexpensively.

In order to achieve the above objects, according to the present invention, there is provided a method of manufacturing a semiconductor substrate, comprising the steps of:

preparing a first substrate having a porous region including at least two layers different in porosity and a non-porous layer formed on the porous region;

bonding a surface of the non-porous layer of the first substrate to a surface of a second substrate;

separating the first and second substrates from each other to transfer the non-porous layer to the second substrate; and removing the residual portion of the porous region remaining on a separation surface of the second substrate or making the residual portion non-porous to smooth the separation surface;

wherein the step for preparing the first substrate comprises a step of forming a first porous layer of 1 μm or less in thickness, a second porous layer adjacent to the first porous layer and high in porosity, and the non-porous layer adjacent to the first porous layer.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

Figure 1A:
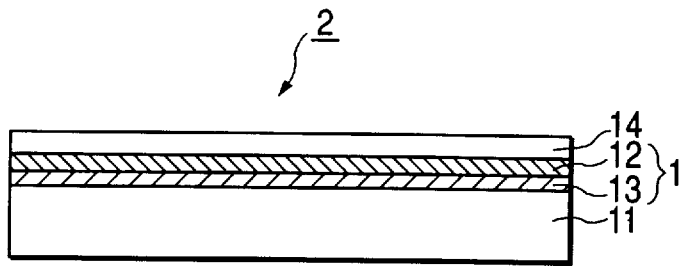
FIGS. 1A, 1B, 1C and 1D are schematical cross-sectional views for explanation of a process of manufacturing a semiconductor substrate according to one example of the present invention.

FIGS. 1A to 1D are schematical cross-sectional views basically showing a method of manufacturing a semiconductor substrate according to the present invention. As shown in FIG. 1A, there is prepared a first substrate 2 having a porous region 1 with at least two layers 12 and 13 different in porosity from each other and a non-porous layer 14 formed on the porous region 1. Reference numeral 11 denotes a base member.

Figure 1B:
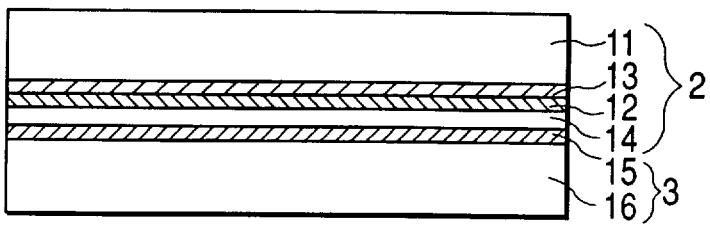

Then, as shown in FIG. 1B, a surface of the non-porous layer 14 on the first substrate 2 is bonded to a surface of a second substrate 3. Reference numeral 15 denotes a non-porous insulating layer, and 16 is a base member.

Figure 1C:
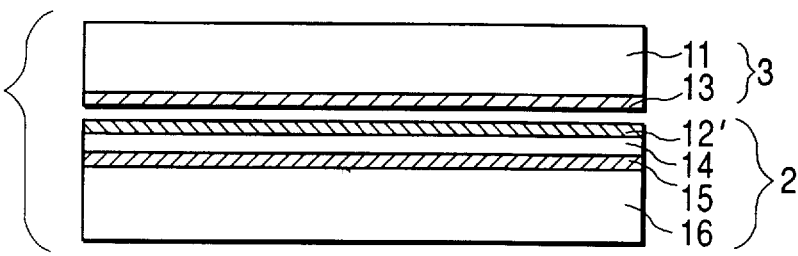

Thereafter, as shown in FIG. 1C, the first substrate 2 and the second substrate 3 are separated from each other in such a manner that the non-porous layer 14 is transferred to the second substrate 3.

Figure 1D:
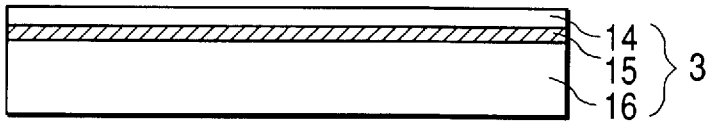

Subsequently, as shown in FIG. 1D, a residual portion 12' of the porous layer 12 remaining on a separation surface of the second substrate 3 is removed or made non-porous to smooth the separation surface.

In particular, as shown in FIG. 1A, in the case where the first substrate 2 is prepared, the first porous layer 12 adjacent to the non-porous layer 14 in the porous region may preferably be made to have a thickness of 1 μm or less, more preferably to 0.5 μm or less. The porosity (PS2) of the second porous layer 13 adjacent to the first porous layer 12 is made higher than the porosity (PS1) of the first porous layer 12.

When the first porous layer 12 having a lower porosity (PS1) interposed between the non-porous layer 14 and the second porous layer 13 having a higher porosity (PS2) is thinned to 1 μm or less, the two substrates are separated from each other in the vicinity of an interface between the first porous layer and the second porous layer substantially in parallel with the surface of the non-porous layer 14.

The residual portion 12' of the first porous layer remaining on the surface of the non-porous layer which has been transferred to the second substarate is of a lower porosity (PS1) and made thin and substantially uniform in thickness over the entire separation surface. The residual portion 12' of the first porous layer is changed into a non-porous structure by subjecting the residual portion 12' to heat treatment in a non-oxidizing atmosphere and integrated with the non-porous layer 14 which is an underlying layer to smooth its surface. As seen in above, upon the removal of residual portion 12', it takes an extremely short time for etching without conducting selective etching or polishing.

The porosity PS1 of the first porous layer according to the present invention may preferably be selected from a range that does not exceed 40%. Specifically, the porosity PS1 may be 1 to 40%.

More preferably, its upper limit may be selected from a range that does not exceed 25%. In particular, the upper limit thereof may be 1 to 25%.

The porosity PS2 of the second porous layer according to the present invention may satisfy the relation of PS2>PS1. It may be preferably made higher than 25%, and more preferably made higher than 40%. In particular, the porosity PS2 may be set to 25 to 90%, and more preferably 40 to 90%.

The thickness of the second porous layer may be selected from a range of from 10 nm to 1 μm. More preferably, the thickness of the second porous layer may be made greater than that of the first porous layer.

The first substrate used in the present invention may include, for example, one in which after the surface of the semiconductor base member 11 is made porous, a non-porous layer is formed on the porous region, one in which a porous layer and a non-porous layer are formed on the base member 11, and one in which after the surface of the base member is made porous, a surface layer of the region made porous is returned to a non-porous structure.

The non-porous layer used in the present invention includes a semiconductor formed by at least either epitaxial growth on the porous region or treatment for changing the porous region to a non-porous structure.

In particular, the non-porous layer is made of semiconductor such as non-porous single crystal Si, GaAs or InP and shaped into a plate or a disc. Also, it is not essential that such a thin film is formed over the entire surface, but the thin film may be partially etched by a patterning process.

An insulating layer such as an oxide film may be formed on the surface side of the non-porous layer.

For example, the porous region can be formed by anodizing Si substrate in an HF solution. The porous layer is structured like sponge where holes or pores of about $10^{-1}$ to 10 nm in diameter are arranged at intervals of about $10^{-1}$ to 10 nm. The density of the porous layer can be changed in a range of 2.1 to 0.6 g/cm$^3$ by changing the concentration of HF solution in a range of 50 to 20%, changing the alcohol addition ratio or changing a current density, in comparison with the density of single crystal Si, 2.33 g/cm$^3$. Also, if the specific resistance and electric conduction type of a portion which is made porous are modulated in advance, the porosity can be changed on the basis of such modulation. In case of the p-type, under the same anodization conditions, a non-degenerate substrate (P$^-$) is smaller in hole diameter than a degenerate substrate (P$^+$), but its hole density is increased by about 1 figure with the result that the porosity is high. In other words, the porosity can be controlled by changing these conditions. In this way, in addition to reducing the density of the porous Si to half or less than that of single crystal Si, the single crystallinity is maintained so that a single crystal layer can be made to epitaxially grow on an upper portion of the porous layer. However, at a temperature of 1,000° C. or higher, pores inside of the porous layer are rearranged, thereby losing accelerating etching characteristics. Therefore, it is presumed that a low-temperature growth such as a molecular beam epitaxial growth, plasma CVD, reduced pressure CVD method, photo-assisted CVD, a bias sputtering method, a liquid-phase growth method or the like is proper for the epitaxial growth of a Si layer on the porous layer. However, high-temperature growth is enabled provided that a protective film is formed in advance on each of the side wall surfaces of the pores formed in the porous layer through a technique such as oxidation.

Then, the porous layer is progressively increased in surface area rather than volume because a large number of micro-cavities are formed inside. In addition, semiconductor material merely exists as a very-thin wall. For that reason, the chemical etching rate is considerably accelerated in cooperation with the suction of an etchant due to capillary action in comparison with the etching rate of a normal single crystal layer.

The mechanical strength of the porous region depends on porosity, but it is presumed that it is weaker than that of a bulk. Also, the mechanical strength becomes further weakened as the porosity increases. In other words, if compression, pulling force or shearing force is exerted on the bonded wafer, the porous layer gets broken first. Also, as the porosity is increased, the porous layer can be destroyed by a weaker force.

The structure of the porous region according to the present invention has at least two layers different in porosity where two layers from the surface side consist of a thin layer low in porosity and a layer high in porosity in the stated order. With the arrangement where a porous layer low in porosity is disposed on the surface, the crystallinity and surface roughness of the non-porous layer formed on the porous region, in particular, the epitaxial layer, are remarkably improved. The crystallinity greatly influences the characteristic of the electronic device formed on the semiconductor substrate, as well as the yield. For example, the crystal defects in the epitaxial layer on a porous layer of 50% in porosity is $1 \times 10^5$/cm$^2$; the crystal defects in the epitaxial layer on a porous layer of 20% in porosity is $5 \times 10^3$/cm$^2$; which is different by one and a half figures under the same growing condition. Also, if the surface roughness is represented by mean square roughness Rrms in the measurement of an area of 50 μm square by atomic force microscopy, the respective roughnesses are 1.2 nm and 0.3 nm, thus being largely different. Incidentally, a large surface roughness is disadvantageous to the bonding process.

The first porous layer with a low porosity at the surface is nearly 1 μm or less in thickness, but if it is more preferably 0.5 μm or less, the residual layer can be made non-porous by the surface smoothing process after the separating step, and the surface can be smoothed. Under this condition, if the porosity of the first porous layer with a low porosity is 40% or less, and more preferably 25% or less, both of the crystal quality and the surface roughness of the epitaxial layer can be satisfied.

The second porous layer with a high porosity directly under the first porous layer with a low porosity can be fabricated by controlling the above-described various conditions of anodization. The thickness of the second porous layer is satisfactorily 10 nm or more, and it is desirable that the thickness is 1 μm or less, more preferably 0.5 μm or less from the viewpoint of restricting a separation position. No problem particularly arises even if a third porous layer is formed directly under the second porous layer, and if the porosity of the third porous layer directly under the second porous, high porosity layer is made lower than that of the second porous layer, the separation position is further stabilized, thereby improving the surface roughness after the surface smoothing treatment is conducted subsequent to the separating step.

Also, the second porous layer with a high porosity can be formed by using both the porous structure producing process and ion implantation.

For example, there has been reported that when ions of helium or hydrogen are implanted into bulk Si and a heat treatment is then conducted on the bulk Si, micro-cavities several to several tens nm in diameter are formed with the density of $10^{16-17}/cm^3$ or less in a region as implanted (e.g., A. Van Veen, C. C. Griffioen, and J. H. Evans, Mat, Res. Soc. Symp. Proc. 107(1988, Material Res. Soc. Pittsburgh, Pa.) p.449).

In recent years, it has been also researched that the micro-cavity group is employed as the gettering site of metal impurities.

V. Raineri and S. U. Campisano have implanted helium ions into bulk Si, conducted a heat treatment to form a cavity group, thereafter formed a groove in a substrate so that the side surface of the cavity group is exposed, and conducted an oxidation treatment. As a result, the cavity group was selectively oxidized to form a buried Si oxide film. In other words, they have reported that the SOI structure can be formed (V. Raineri, and S. U. Canpisano, Appl. Phys. Lett. 66 (1995) p.3654). However, in their methods, the thicknesses of the surface Si layer and the buried Si oxide layer are set such that both formation of the cavity group and the relief of a stress developed by the expansion of a volume at the time of oxidation are satisfied, and also the formation of a groove is required for selective oxidation. As a result, the SOI structure could not be formed over the entire substrate. The formation of the cavity group has been reported as a link to the research relating to the inflation of those cavity groups and the separation phenomenon, as well as a first furnace wall of a nuclear fusion reactor as a phenomenon accompanied with the implantation of light elements into a metal.

It is well known that bubbles occur in the ion implanted layer as described above, and the ion implanted layer is structured as if a porous structure is formed inside of the ion implanted layer. Therefore, that layer is mechanically weak and enables accelerated oxidation and accelerated etching.

The ion implantation elements are not limited to hydrogen or rare gas, if an implantation damage layer, a high-concentration layer (strain layer) of implanted elements or a bubble layer is formed in the vicinity of the interface.

Provided that ion implantation is conducted in such a manner that a projection range is contained in the porous layer formed by anodization, bubbles are formed in pore walls of the porous material in the vicinity of the projection range, thereby enhancing the porosity. The ion implantation may be made before or after the formation of the porous layer by anodization. Further, the ion implantation may be made even after the non-porous layer structure is formed.

In the epitaxial growth process on the porous layer, as its first step, baking (heat treatment) in $H_2$ for embedding the surface pores of the porous Si is greatly effective in making the quality of the epitaxial layer high (N. Sato, et al., J. Electrochem. Soc., Vol. 142, No. 9, 3116 (1995)). The constituent atoms of the outermost surface porous layer are consumed for embedding the holes during the $H_2$ baking process. Therefore, if the outermost surface before being $H_2$-baked is a thin layer low in porosity, the sealing of the pores during the hydrogen baking process is promoted. If the thin layer low in porosity is made thin to about 1 μm or less, more preferably 0.5 μm or less, a porous layer having a high porosity can be disposed downward in the vicinity of the epitaxial layer which has been subjected to epitaxial growth, so that the separation can occur in the porous region close to the epitaxial layer. Also, the thickness of the thin layer having a low porosity remaining after separation can be set to a value lower than 1 μm, sometimes lower than 0.5 μm so as to be smoothed in the subsequent smoothing process. Also, provided that the base member where a porous region is formed is immersed in the HF solution prior to $H_2$ baking to remove the oxide film on the porous side wall of the pores in the vicinity of the surface of the porous layer, the oxide film is removed by HF, and a portion of the exposed surface layer which has not been made non-porous develops coagulation of pores during the heat treatment including the $H_2$ baking process, and has no oxide film on the side wall of the pores, and further becomes weakened in mechanical strength, to thereby form a layer at which separation is easily made.

After the anodization, when the porous layer is subjected to a high-temperature process such as epitaxial growth, surface oxidation or bonding heat treatment without being oxidized at a low temperature, the porous layer is structurally changed such that the fine pores at the time of anodization are agglomerated and enlarged. Employing this phenomenon, separation can be promoted in the vicinity of the interface between of the epitaxial and porous layer due to the enlargement of the pores directly under the epitaxial layer and the strain between the porous Si and the epitaxial Si.

In the present invention, subsequent to the separation of the bonded wafer at the second porous layer high in porosity, the residual portion low in porosity remaining on the surface of the transferred non-porous layer is subjected to a smoothing process.

A heat treatment under a non-oxidizing atmosphere or a heat treatment in a vacuum is proper for the smoothing process, but the smoothing process is not limited by those treatments. In the heat treatment, hydrogen, inert gas such as He, Ne, N, Ar, Kr, Xe or the like, or an atmosphere where those gases are mixed is particularly desirable as the non-oxidizing atmosphere. In the heat treatment in a vacuum, desirable vacuum is $10^{-7}$ Torr or below. In any case, the residual oxygen and water remaining in the atmosphere as impurities oxidize the surface to form a protective film. Since the protective film impedes the smoothing of the surface, residual oxygen and water need to be lowered. It is desirable that the atmosphere is set to −92° C. or below.

In case of such an atmosphere, the surface roughness is smoothed by migration of the surface atoms which minimizes the surface energy. In particular, if hydrogen is contained in the atmosphere, the formation of the protective film is restrained by its reducing action to promote surface smoothing. As a result of studying the relation between the surface smoothing effect and the thickness of the residual porous layer, the present inventors have found that if the thickness of the porous layer is about 1 μm or less, more preferably 0.5 μm or less, the surface is smoothed by a heat treatment, and cavities resulting from the residual pores can be prevented from being produced in the layer which has been smoothed. That is, the layer can be made non-porous. In the case where the residual porous layer is thick, the residual pores are liable to remain in the interior of the layer. In the flattening due to the heat treatment, since the surface smoothing is progressed by migration of the surface atoms, the etching quantity is kept extremely low. In particular, in the case where the residual oxygen and water in the atmosphere are kept low, the etching amount can be set almost to 0.

As has been reported up to now, because no long selective etching process is required, in addition to the effect of the reduction or deletion of the process, deterioration of the uniformity of the layer thickness due to excessive etching of the non-porous layer which occurs when the selective ratio of etching is not sufficient hardly occurs. Therefore, the uniformity of the epitaxial Si layer as the non-porous layer is not deteriorated at all.

According to the present invention, the epitaxial Si film formed on the single crystal porous layer as the non-porous layer can be separated and transferred to another substrate without conducting selective etching. In particular, because a defect inherent to bulk Si is not propagated to the epitaxial Si film, the yield of the device can be improved. Even at the present, the epitaxial wafer is used for high-performance LSI such as a CPU. It is said that an increase in the diameter of wafers is anticipated in the future, making it difficult to manufacture high-quality crystal through a pull method, and it is presumed that maintaining wafer quality will be difficult. Therefore, the necessity of the epitaxial wafer is increased more and more. It is needless to say that the necessity of the epitaxial film is increased in the SOI base member by which the bulk wafer is replaced.

Also, because the electric conductive type and the impurity concentration of the non-porous layer can be set arbitrarily by controlling the electric conductive type and the impurity concentration at the time of epitxial growth, various SOI substrates different in electric conductive type or impurity concentration can be manufactured from the same first substrate.

Furthermore, if the epitaxial film having a multi-layer structure different in the electric conductive type and impurity concentration is formed, in particular, an SOI substrate having a high-concentration buried layer can be manufactured as a multi-layer SOI substrate from the original.

The above wide and various operations are disenabled by a method as disclosed in Japanese Patent Application Laid-Open No. 5-211128 in which the outermost surface layer of bulk wafer is peeled off by ion implantation and then transferred to another substrate.

Also, in the case where both of the porous region and an underlying layer portion of the non-porous layer which is in contact with the porous region are formed of epitaxially grown layers, the first substrate can be reused semi-permanently without reduction in the thickness of the substrate even if it is used many times. Hence, in addition to quality enhancement, the above structure has great advantages from the viewpoints of the resource conservation and cost saving, particularly with respect to large-diameter wafers.

Also, in the compound semiconductor single crystal, it was difficult and expensive to obtain a wafer large in diameter and excellent in crystallinity. According to the present method, using hetero-epitaxial growth on the porous Si region, a compound semiconductor single crystal film excellent in crystallinity can be formed on a large-area substrate.

On the other hand, in the present invention, the surface layer of the substrate made porous can be transformed into a non-porous single crystal layer by a heat treatment at a temperature of the melting point or below. In this case, the non-porous single crystal layer excellent in crystallinity can be formed on the surface of the substrate made porous without using a semiconductor source gas such as silane. Also, after the surface of the non-porous single crystal layer as formed is oxidized and then bonded to another substrate, the non-porous single crystal layer is bonded to another substrate whose surface is oxidized, or the surfaces of both the substrates are oxidized and bonded to each other, those substrates are separated at the high porosity layer, and then the residual portion low in porosity is smoothed. As a result, there can be formed a single crystal layer having an excellent single crystal structure on the oxide layer, uniformly flat over the large area and remarkably reduced in defects.

Further, in the method of manufacturing the semiconductor substrate according to the present invention, after the residual porous layer is removed, though it may remain as is if removal is unnecessary, it is subjected to surface flattening processing if the surface flatness is insufficient. In this way, the first Si substrate separated by the above method can be reused as a first base member, as a subsequent second base member or as a base member used for another purpose. The surface flattening processing may be conducted by a polishing or etching method, etc., used in a normal semiconductor process, or may be conducted by a heat treatment under a non-oxidizing atmosphere. Hydrogen, inert gas or an atmosphere where those gases are mixed is particularly desirable as the non-oxidizing atmosphere. Alternatively, it may be a heat treatment in vacuum. The heat treatment can locally flatten it to the degree that the atom step appears locally by selecting the conditions.

Also, in the case where the first substrate after the non-porous layer is transferred is again repeatedly used as a first base member, the first base member can be reused many times until it cannot be forcedly used.

Because the first substrate is held to the original without being made porous other than the surface layer, both the surfaces of the first substrate are regarded as main surfaces, and base members are bonded to the respective surfaces, thereby being capable of manufacturing a two-sheet bonded SOI substrate from one first substrate at the same time. Thus, the process can be shortened to improve the producibility. The separated first substrate can be reused.

The substrate thus obtained can be substituted for expensive SOS or SIMOX when the large-scaled integrated ciruit of the SOI structure is manufactured.

As the second substrate, there are, for example, an Si base member and an Si oxide film formed on the Si base member. Alternatively, it may be a light transmissive insulating base member such as quartz, fused quartz, silica glass, glass or sapphire, or a metal base member. Thus, it may not be limited practically.

Referring to FIGS. 2A to 2F, an embodiment of the present invention will be described.

Figure 2A:
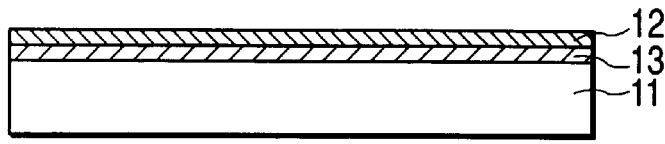
FIGS. 2A, 2B, 2C, 2D, 2E and 2F are schematical cross-sectional views for explanation of a process of manufacturing a semiconductor substrate according to another example of the present invention.

As shown in FIG. 2A, there is prepared a first Si single crystal base member 11, and a porous region consisting of at least two layers having a first porous layer 12 of low porosity and a second porous layer 13 of high porosity on the main surface from the surface side. The layer 13 consists of at least one layer. The porous Si can be formed by conducting anodization on the Si base member in the HF solution. The thickness of the low porosity thin layer is described above. On the other hand, the high porosity layer of the second porous layer is higher in porosity than the low porosity thin layer. In the case where a third porous layer is further formed lower in porosity than the high porosity layer, the second porous layer is desirably higher in porosity than the third porous layer. In other words, it is desirable that the porosity of the second porous layer is the largest in the porous region. Also, the thickness of the second porous layer is described above.

Figure 2B:
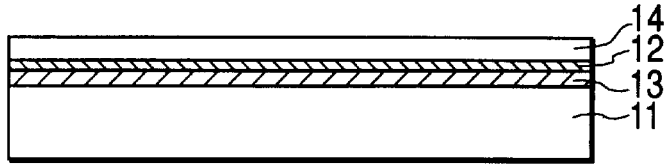

As shown in FIG. 2B, at least one non-porous layer 14 is formed on the porous regions 12 and 13. The non-porous layer 14 is formed of the above-described materials, including particularly single crystal Si, polycrystal Si, amorphous Si, a metal film, a compound semiconductor thin film, a super-conductive thin film or so on. A device structure such as MOSFET may be formed on the non-porous layer. If it is of the multi-layer structure, it may be an SOI having a buried layer. Further, it is better to form an insulating film 15 such as $SiO_2$ on the outermost layer because the interfacial level of the bonded surface can be isolated from an active layer.

Figure 2C:
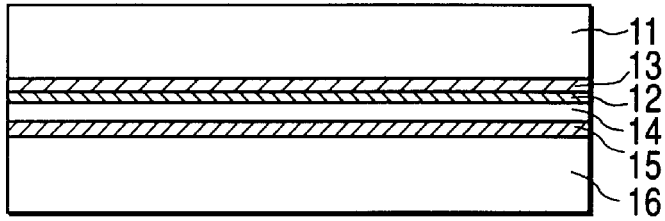

As shown in FIG. 2C, the surface of a second base member 16 and the surface of the first substrate are made to adhere to each other at room temperature.

FIG. 2C shows a state where the second base member and the first substrate are bonded to each other through the insulating layer 15. In the case where the non-porous layer 14 is not Si or the second base member is not Si, no insulating layer 15 may be provided.

In bonding the substrates, an insulating thin plate may be interposed therebetween so that they may be bonded in a three-sheet superimposed manner.

Figure 2D:
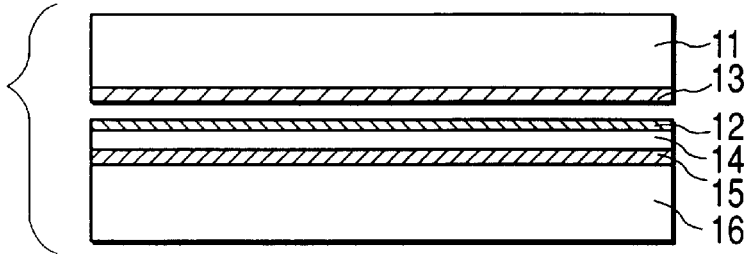

As shown in FIG. 2D, the substrates are separated at the outermost thin film in the second porous layer 13 on the first porous layer 12 side. The separating method may be a method of applying an external pressure due to pressure, tensile force, shearing force or a wedge, application of supersonic wave, application of heat, application of inner pressure to the interior of the porous region by inflating the porous Si from the periphery by oxidation, heating in a pulse-like manner to apply a heat stress, softening or the like. But, it is not limited by or to those methods.

Subsequently, the smoothing processing is conducted on the surface of the second substrate which accompanies the non-porous quality producing action on the residual portion of the first porous layer 14. The smoothing process is described above.

Figure 2E:
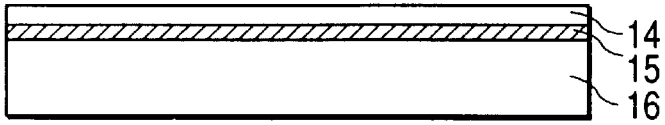

As a result of the above, the semiconductor substrate shown in FIG. 2E is obtained. The non-porous layer 14, for example, single crystal Si thin film is made thin flatly and uniformly on the second base member 16 and formed in a large area over the entire wafer. If the second substrate and the first substrate are bonded to each other through the insulating layer 15, there is formed a semiconductor substrate suitable for the manufacture of the electronic device insulation-isolated.

Figure 2F:
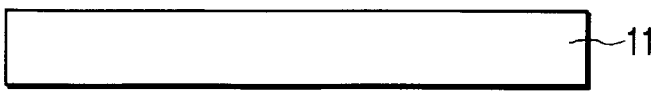
Figure 3A:
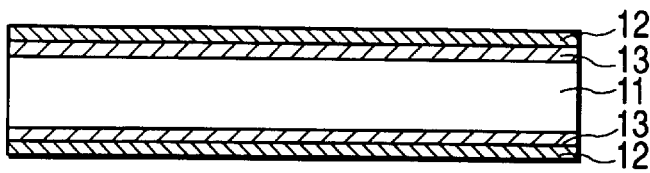
FIGS. 3A, 3B, 3C, 3D, 3E and 3F are schematical cross-sectional views for explanation of a process of manufacturing a semiconductor substrate according to still another example of the present invention.
Figure 3B:
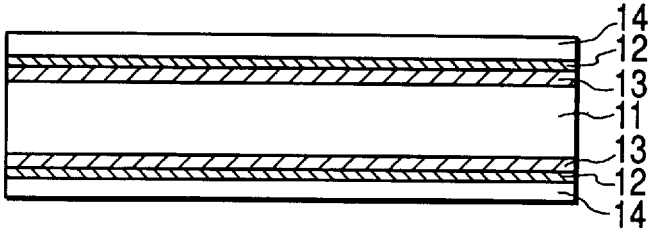
Figure 3C:
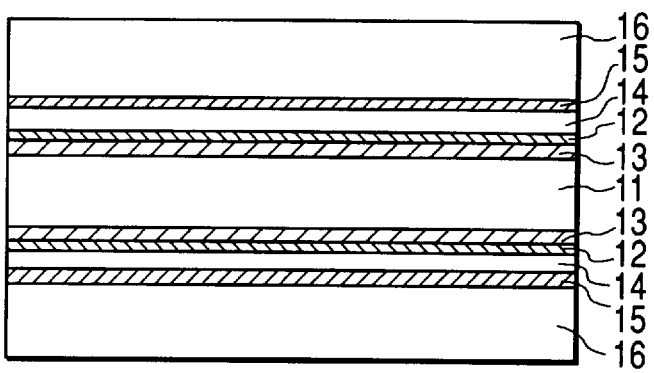
Figure 3D:
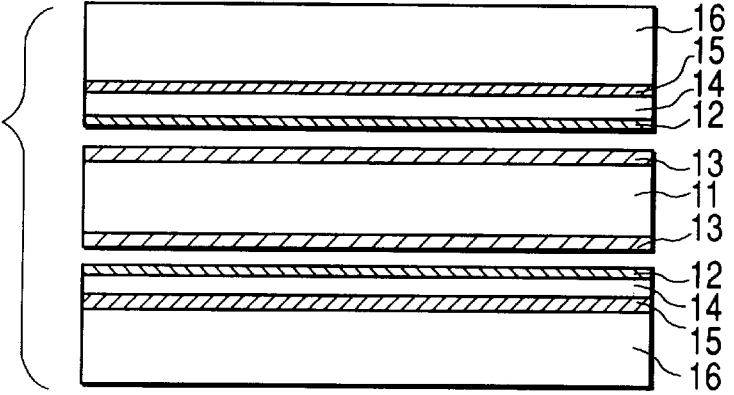
Figure 3E:
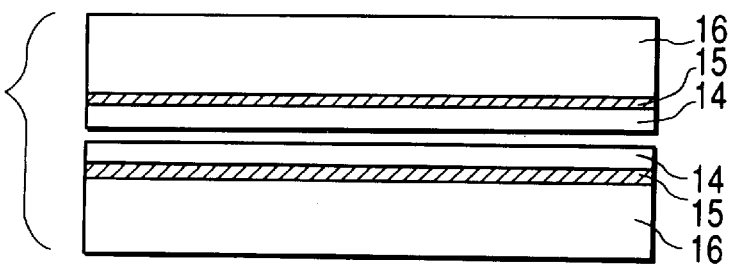
Figure 3F:
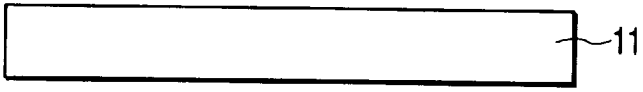

The first Si single crystal base member 11 is reused as a first base member 11 or as a second base member 16 after the residual portion of the second porous layer is removed if it is unnecessary and the surface is smoothed in the case where the surface is unacceptably rough as shown in FIG. 2F. The process shown in FIGS. 2A to 2F is again repeated to manufacture another semiconductor substrate.

The semiconductor manufacturing process shown in FIGS. 1A to 1D or 2A to 2F is conducted on both surfaces of the first base member using two second base members so that two semiconductor substrates can be manufactured at the same time. This method is shown in FIGS. 3A to 3F.

The first base member 11 can be reused as a first base member 11 or as one of two second base members 16 after the residual porous layers 13 on both the surfaces are removed if they are unnecessary and the surface is smoothed in the case where the surface is unacceptably rough.

The two base members 16 may not be identical in size and material.

The two non-porous layers 14 may not be identical in size and material.

No insulating material 15 may be provided.

Because the conventional bonding substrate manufacturing method is made using a method of sequentially removing the first Si base member from one surface thereof by polishing or etching, it is impossible that both surfaces of the first Si base member are effectively utilized and bonded to another base member. However, according to the above embodiment, because the first Si substrate is maintained as it is except for its surface layer, both surfaces of the first Si substrate can be used as main surfaces, and a base member can be bonded to each surface, so that two bonded substrates can be manufactured from the single first Si base member at the same time. As a result, the process can be reduced, and the productivity can be improved. It is needless to say that the separated first Si base member can be reused.

For example, in case of a silicon base member, the surface layer of the silicon base member is made porous and transformed into a non-porous silicon single crystal layer by a heat treatment using a temperature of the melting point or less after the Si base member is made porous. As a result, a silicon single crystal layer excellent in crystallinity can be formed on the surface of the silicon base member made porous without using a silicon-containing source gas such as silane.

Figure 4A:
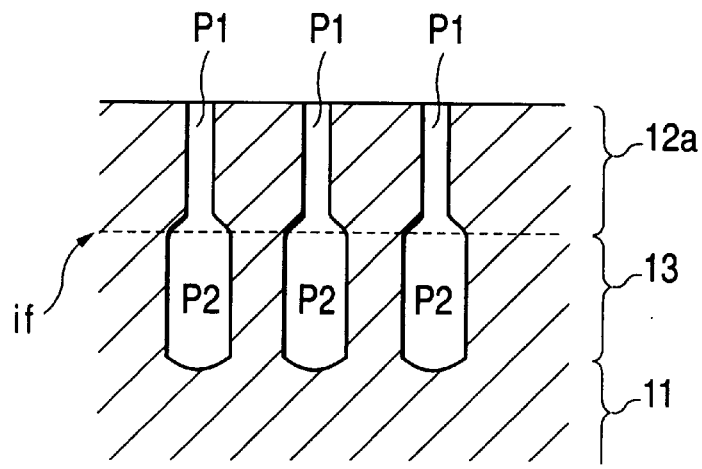
FIGS. 4A, 4B and 4C are schematical cross-sectional views for explanation of a step of producing a non-porous layer.
Figure 4B:
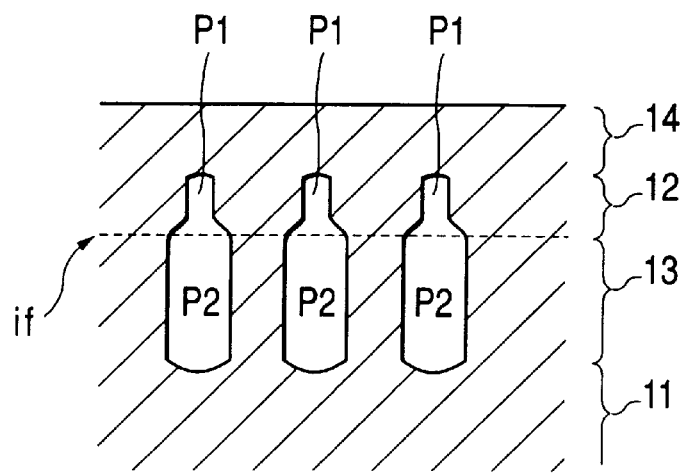
Figure 4C:
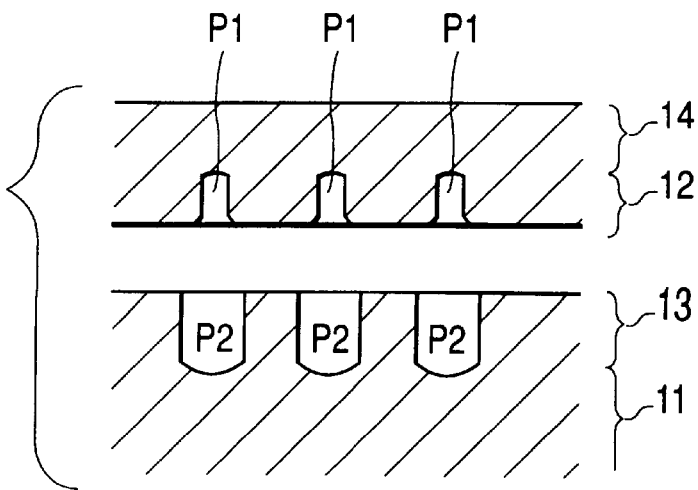
Figure 5A:
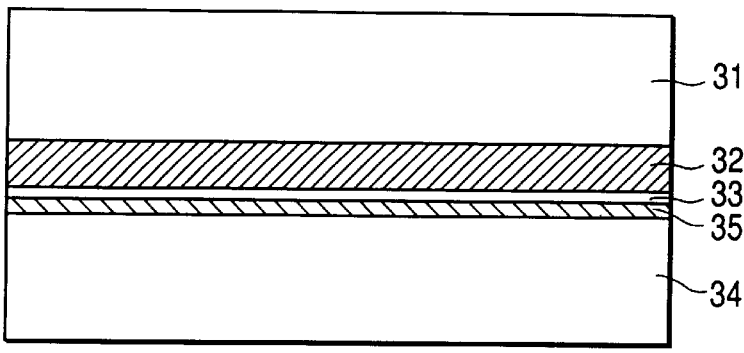
FIGS. 5A, 5B and 5C are schematical cross-sectional views for explanation of a process of manufacturing a semiconductor substrate according to a first conventional example.
Figure 5B:
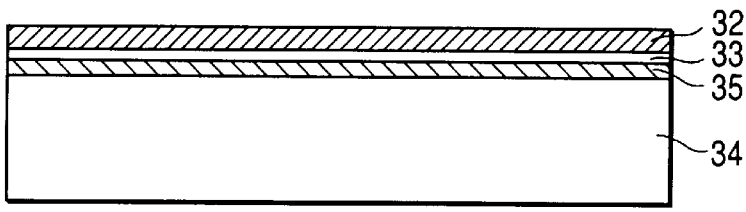
Figure 5C:
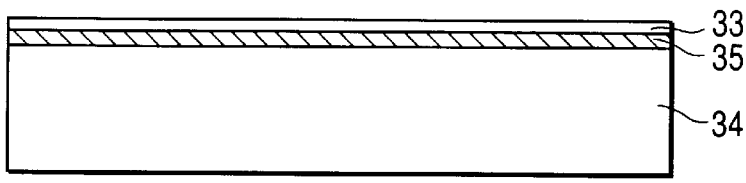
Figure 6A:
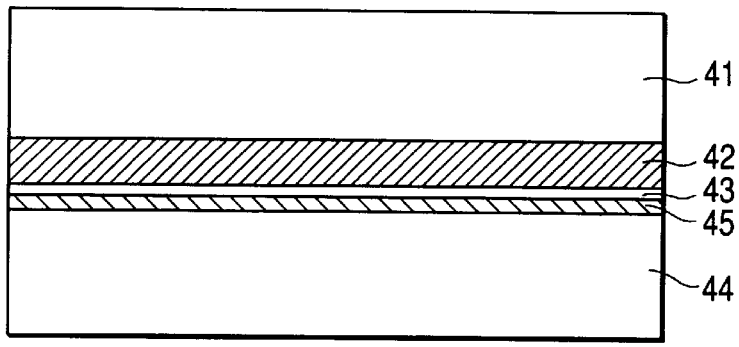
FIGS. 6A, 6B and 6C are schematical cross-sectional views for explanation of a process of manufacturing a semiconductor substrate according to a second conventional example.
Figure 6B:
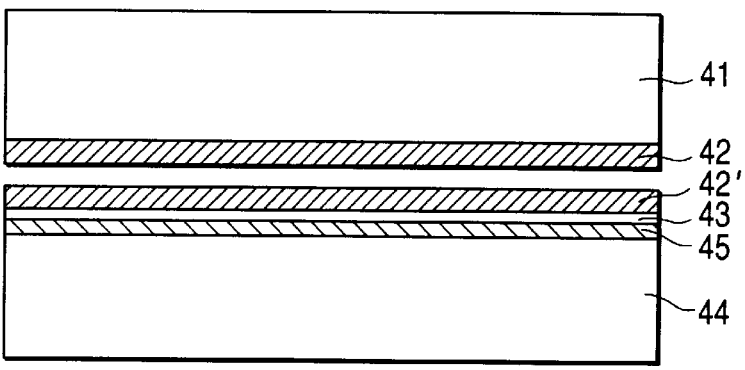
Figure 6C:
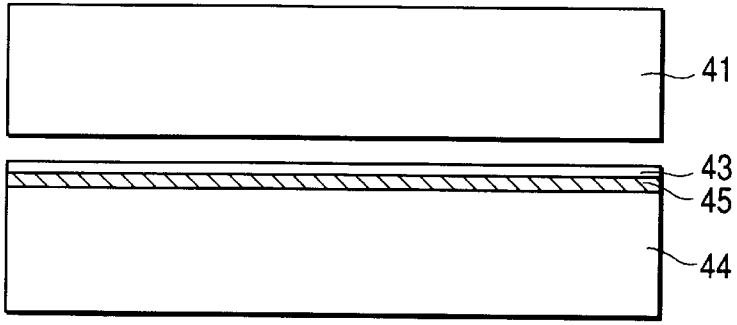

FIGS. 4A to 4C schematically show the appearance of the porous region in a step of forming the first porous layer and the second porous layer, a step of forming the non-porous layer and a separating step according to the present invention.

FIG. 4A schematically shows a low porosity layer 12a low in porosity and having pores P1 and a second porous layer 13 high in porosity and having holes P2 with a larger diameter than the pores P1 formed on the surface of the base member 11.

FIG. 4B schematically shows a portion of the low porosity layer 12a on the surface side made non-porous by conducting a heat treatment to form a non-porous layer 14 as a process of forming the non-porous layer. In other words, a laminated body consisting of the second porous layer 13, the first porous layer 12 and the non-porous layer 14 are formed on the surface of the base member 11.

FIG. 4C schematically shows that the substrates have been separated, that is, where an interface portion of the second porous layer on the interface side between the first porous layer 12 and the second porous layer 13 is partially destroyed and separated.

FIGS. 4A to 4C schematically facilitate understanding of the present invention. However, the form of the pores in the porous layer and the configuration of the separated surface are usually more complicated.

Also, the thickness of the non-porous layer 14 may be increased by conducting epitaxial growth, etc., after the non-porous quality producing process (FIG. 4B).

EXAMPLE 1

A surface layer of a first single crystal Si substrate was anodized in an HF solution.

The anodization conditions are stated below.
Current density: 7 (mA·cm$^{-2}$)
Anodization solution: HF:H$_2$O:C$_2$H$_5$OH=1:1:1
Period of time: t (min)
Thickness of porous Si: x($\mu$m)
Further,
Current density: 50 (mA·cm$^{-2}$)
Anodization solution: HF:H$_2$O:C$_2$H$_5$OH=1:1:1
Period of time: 10 (sec)
Thickness of porous Si: 0.2 ($\mu$m)

The first anodization period t was changed to 0, 0.2, 0.5, 1.0 and 1.5 min, respectively, such that a thickness of a first porous layer having a low porosity becomes 0, 0.2, 0.5, 1.0 and 1.5 $\mu$m.

Through the anodization where the current density was set to 50 mA·cm$^{-2}$, the porosity of a second porous Si layer becomes large, to thereby form a thin film having a high porosity which is structurally fragile.

After being inserted into an epitaxy apparatus, the wafer was disposed in a hydrogen atmosphere and baked at 1,060° C. When the sample was observed through a scanning electron microscope, it was recognized that the surface pores of the porous Si were sealed. As a result, the outermost surface layer of the thin film having a low porosity was consumed, thereby burying the holes and being rendered non-porous. In particular, the low porosity layer was formed in a predetermined thickness of 1.0 $\mu$m or less. Thereafter the surface layer was made non-porous, and the remaining low porosity layer became 0.5 $\mu$m or less in thickness. Sequentially, single crystal Si was allowed to epitaxially grow in a thickness of 0.3 $\mu$m on the porous Si through a CVD (Chemical Vapor Deposition) method. The growth conditions are stated below.
Source gas: SiH$_2$Cl$_2$/H$_2$
Gas flow rate: 0.2/180 l/min
Gas pressure: 760 Torr
Temperature: 1060° C.
Growth rate: 0.15 $\mu$m/min Furthermore, an SiO$_2$ layer of 200 nm thickness was formed on the surface of the epitaxial Si layer through thermal oxidation.

After the surface of the SiO$_2$ layer was superimposed on a surface of another Si substrate (second substrate) and brought into contact with the latter, the substrate was annealed at 1180° C. for 5 minutes, with the result that the bonding became firm.

As a result of separating the bonded wafers, they were divided in the vicinity of an interface in the high porosity layer between the high porosity layer and the low porosity layer. Any methods may be used for separation. Subsequently, the substrate was located in a normal-pressure hydrogen atmosphere and subjected to a heat treatment at 1100° C. for 4 hours. As a result, the thin layer having a low porosity remaining on the second substrate was completely made non-porous. As a result of observing the section of the thin layer through an electron microscope, any remaining voids could not be located. As a result of observing a surface roughness through an atomic force microscope, it could be recognized that the root mean square roughness in a region of 50 $\mu$m square was about 0.5, 0.2, 0.2, 0.4 and 1.5 nm when the thickness of the porosity layer was 0, 0.2, 0.5, 1.0 and 1.5 $\mu$m, and a surface roughness of the thin layer having a low porosity which is 1.0 $\mu$m or less in thickness was equivalent to that of the Si wafer normally on the market. Likewise, as a result of measuring the crystal defect density, the lamination defect density was about 1×10$^5$, 6×10$^3$, 5×10$^3$, 5×10$^3$, and 5×10$^3$/cm$^2$ when the thickness of the low porosity layer was 0, 0.2, 0.5, 1.0 and 1.5 $\mu$m, and crystal defect density was remarkably reduced by introduction of the thin layer with a low porosity.

In the above way, the single crystal Si layer with a low defect density could be formed on the Si oxide film. When the thickness of the single crystal Si layer as formed was measured over the entire surface at 100 points, the uniformity of the thickness was 211±4 nm, 412±9 nm, 690±14 nm, 1201±24 nm and 1707±34 nm, respectively. Since the single crystal Si layer also includes a portion where the low porosity layer is made non-porous, the thickness thereof is different.

The roughness remaining on the first Si substrate side was subjected to surface treatment such as hydrogen annealing or surface polishing as the surface smoothing process; the substrate could be used again as a first substrate or as a second substrate. In this situation, when the porous Si remains in a relatively large amount, selective etching may be conducted using a mixed solution consisting of 49% hydrofluoric acid and 30% hydrogen peroxide solution while stirring, and thereafter the substrate may be subjected to surface treatment such as hydrogen annealing or surface polishing, so that the substrate may be again used as a first substrate or as a second substrate.

EXAMPLE 2

A surface layer of a first single crystal Si wafer was anodized in an HF solution.

The anodization conditions are stated below.
Current density: 7 (mA·cm$^{-2}$)
Anodization solution: HF:H$_2$O:C$_2$H$_5$OH=1:1:1
Period of time: 0.1 (min)
Thickness of first porous Si layer: 0.1 ($\mu$m)
Further,
Current density: 50 (mA·cm$^{-2}$)
Anodization solution: HF:H$_2$O:C$_2$H$_5$OH=1:1:1
Period of time: 5 (sec)
Thickness of second porous Si layer: 0.1 ($\mu$m)

Still further, a third layer may be manufactured. The conditions are, for example, stated below.
Current density: 7 (mA·cm$^{-2}$)
Anodization solution: HF:H$_2$O:C$_2$H$_5$OH=1:1:1
Period of time: 1 (min)
Thickness of third porous Si layer: 1 ($\mu$m)

Through the anodization, the porosity of the porous Si layer becomes the largest in the porous region where the current density was set to 50 (mA·cm), whereby a high porosity layer which is structurally fragile was formed under the thin layer having a low porosity.

The wafer was oxidized at 400° C. for one hour in an oxygen atmosphere. Through this oxidation, the inner wall of each the hole in the porous Si was covered with a thermal oxide film. The wafer was immersed in the HF aqueous solution of 1% for about 30 seconds, to thereby remove the very-thin thermal oxide films formed on the surface of the porous Si and the inner walls of the holes in the vicinity of the surface. After being inserted into a super-high vacuum device, the wafer was baked at 1000° C. under 1×10$^{-9}$ Torr for 5 minutes. The sample was taken out and observed through a scanning electron microscope. It has been recognized that the surface holes of the porous Si were sealed. As a result, the outermost surface layer of the thin layer having a low porosity was consumed, thereby burying the holes and being rendered non-porous. Sequentially, the substrate was located in an epitaxial growth device, and the single crystal Si was allowed to epitaxially grow in a thickness of 1 µm on the porous Si through a CVD method. The growth conditions are stated below.

Source gas: $SiH_2Cl_2/H_2$
Gas flow rate: 0.4/180 l/min
Gas pressure: 80 Torr
Temperature: 900° C.
Growth rate: 0.15 µm/min Furthermore, an $SiO_2$ layer of 200 nm thickness was formed on the surface of the epitaxial Si layer through thermal oxidation.

After the surface of the $SiO_2$ layer was superimposed on a surface of another Si substrate (second substrate) and brought in contact with the latter, the substrate was annealed at 1100° C. for 10 minutes, with the result that the bonding became firm.

As a result of separating the bonded wafers, in the case where anodization current density of a third layer was set to 7 $mA/cm^2$, they were divided in the vicinity of an interface between the first porous layer and the second porous layer in the high porosity layer of the second layer. In other words, when the porosity of the second layer was set to the largest porosity in the porous layer structure, separation was readily made. Subsequently, the second substrate was placed in a hydrogen atmosphere under a pressure of 50 Torr, and subjected to a heat treatment at 1100° C. for 2 hours. As a result, the thin layer having a low porosity remaining on the surface of the epitaxial Si layer transferred onto the second substrate was completely made non-porous. As a result of observing the section of the thin layer through an electron microscope, no residual cavities, etc., could be recognized. As a result of evaluating the surface roughness through an atomic force microscope, the mean square roughness in a region of 50 µm square was about 0.3 nm, and the surface roughness was equivalent to that of the Si wafer normally on the market. Likewise, as a result of measuring the crystal defect density, the lamination defect density was $5 \times 10^3/cm^2$, and crystal defect density was remarkably reduced by introduction of the thin layer having a low porosity.

As a result of the above, the single crystal Si layer with a low defect density could be formed on the Si oxide film of the second substrate. As a result of measuring a thickness of the single crystal Si layer as formed over the entire surface at 100 points, uniformity of the thickness was 1011±22 nm, respectively.

Even if the oxide film is formed not on the surface of the epitaxial layer but on the surface of the second substrate, or on both of those surfaces, the same effects could be obtained.

The porous Si remaining on the surface of the second substrate was selectively etched using a mixed solution consisting of 49% hydrofluoric acid and 30% hydrogen peroxide solution while stirring. Thereafter, the substrate was subjected to surface treatment of hydrogen annealing, so that the substrate could be used as a first substrate again or as a second substrate.

EXAMPLE 3

A surface layer of a first single crystal Si substrate was anodized in an HF solution.

The anodization conditions are stated below.
Current density: 7 ($mA \cdot cm^{-2}$)
Anodization solution: $HF:H_2O:C_2H_5OH=1:1:1$
Period of time: 3 (min)
Thickness of porous Si: 3 (µm)

The substrate was oxidized under an oxygen atmosphere at 400° C. for 1 hour. Through the oxidation, the inner walls of the respective holes in the porous Si were covered with thermal oxide films. Ion implantation was made in such a manner that a projection range from the wafer surface came in the porous Si and in the vicinity of a portion apart from the surface by 0.3 µm. The ion implantation elements are not particularly limited, but any elements can be applied if an implantation damage layer, a high-concentration layer (strain layer) of implanted elements or a bubble layer is formed in the vicinity of the interface.

The single crystal Si was allowed to epitaxially grow in a thickness of 0.15 µm on the porous Si through a CVD method. The growth conditions are stated below.

Source gas: $SiH_2Cl_2/H_2$
Gas flow rate: 0.5/180 l/min
Gas pressure: 80 Torr
Temperature: 900° C.
Growth rate: 0.15 µm/min Furthermore, an $SiO_2$ layer of 100 nm thickness was formed on the surface of the epitaxial Si layer through thermal oxidation.

After the surface of the $SiO_2$ layer was superimposed on a surface of another Si substrate (second substrate) and brought in contact with the latter, the substrate was annealed, with the result that the bonding became firm. The annealing is conducted under the conditions where an implantation damage layer, a high-concentration layer (strain layer) of implanted elements or a bubble layer is not diffused. As a result of observing the section of the thin layer through an electron microscope, it could be recognized that the porosity of the porous layer at a position where ions were implanted increased. That is, a high porosity layer which will form a separation layer later was formed by ion implantation.

As a result of separating the bonded wafers, they were divided at the high porosity layer which was formed by ion implantation.

Sequentially, the second substrate was located in an atmosphere where $H_2$ was diluted with Ar and subjected to a heat treatment at 1200° C. for 2 hours. As a result, the thin layer having a low porosity remaining on the surface of the single crystal Si layer transferred onto the second substrate was completely made non-porous. As a result of observing the section of the thin layer through an electron microscope, no residual cavities, etc., could be recognized. As a result of evaluating the surface roughness through an atomic force microscope, the mean square roughness in a region of 50 µm square was about 0.3 nm, and the surface roughness was equivalent to that of the Si wafer normally on the market. Likewise, as a result of measuring the crystal defect density, the lamination defect density was $6 \times 10^3/cm^2$, and crystal defect density was remarkably reduced by introduction of the thin layer having a low porosity.

As a result of the above, the single crystal Si layer with low defect density could be formed on the Si oxide film. As a result of measuring a thickness of the single crystal Si layer as formed over the entire surface at 100 points, the uniformity of the thickness was 311±6.2 nm, respectively.

The porous Si remaining on the surface of the first substrate was selectively etched using a mixed solution consisting of 49% hydrofluoric acid and 30% hydrogen peroxide solution while stirring. Thereafter, the first substrate was subjected to surface treatment of hydrogen annealing, so that the first substrate could be again used as a first substrate or as a second substrate.

EXAMPLE 4

Boron was diffused on a surface of a first p⁻ single crystal Si substrate in advance so that a p⁺ layer was formed in a thickness of about 0.2 μm.

Subsequently, the surface layer of the substrate was anodized in an HF solution.

The anodization conditions are stated below.
Current density: 7 (mA·cm⁻²)
Anodization solution: $HF:H_2O:C_2H_5OH=1:1:1$
Period of time: 2 (min)

As a result of observing the substrate through a scanning electron microscope, it has been recognized that a layer having 20% porosity was formed in a thickness of 0.2 μm on the surface, and a porous layer having 50% porosity was formed in a thickness of about 0.4 μm under that layer.

The substrate was oxidized under an oxygen atmosphere at 400° C. for 1 hour. Through the oxidation, the inner walls of the respective holes in the porous Si were covered with thermal oxide films. After being inserted into an epitaxy device, the wafer was baked at 1060° C. for 5 minutes, and further baked while a Si source is applied in a small amount, to thereby bury the surface holes of the porous Si. The single crystal Si, a p-epitaxial layer of 0.45 μm thickness, and an n⁺ epitaxial layer of 1.0 μm were allowed to epitaxially grow on the porous Si where the surface holes were buried through a CVD (Chemical Vapor Deposition) method. The growth conditions are stated below.
Source gas: $SiH_2Cl_2/H_2$
Gas flow rate: 0.5/180 l/min
Gas pressure: 80 Torr
Temperature: 900° C.
Growth rate: 0.15 μm/min Furthermore, an $SiO_2$ layer of 100 nm thickness was formed on the surface of the epitaxial Si layer through thermal oxidation.

After the surface of the $SiO_2$ layer and a surface of another Si substrate (second substrate) were treated with $O_2$ plasma and washed with water, they were superimposed one on another and brought in contact with each other, and then annealed at 400° C. for 60 minutes, with the result that the bonding became firm.

As a result of separating the bonded wafers, they were divided at the high porosity layer in the vicinity of an interface of the low porosity layer.

Subsequently, the second substrate was located in a superhigh vacuum device where residual oxygen and moisture were satisfactorily removed, and then subjected to a heat treatment under a pressure of $1 \times 10^{-9}$ Torr at 950° C. for 4 hours. As a result, the thin layer having a low porosity remaining on the second substrate was completely made non-porous. As a result of observing the section of the thin layer through an electron microscope, no residual cavities, etc., could be recognized. As a result of evaluating the surface roughness through an atomic force microscope, the mean square roughness in a region of 50 μm square was about 0.5 nm, and the surface roughness was equivalent to that of the Si wafer normally on the market. Likewise, as a result of measuring the crystal defect density, the lamination defect density was $6 \times 10^3/cm^2$, and crystal defect density was remarkably reduced by introduction of the thin layer having a low porosity.

As a result of the above, a single crystal Si layer including an n⁺ buried layer and having the thickness of 1.6 μm could be formed on the Si oxide film of the second substrate. As a result of measuring a thickness of the single crystal Si layer as formed over the entire surface at 100 points, uniformity of the thickness was 1.6±0.03 μm, respectively.

After the roughness remaining on the surface of the first substrate side was subjected to surface treatment with hydrogen annealing as the surface flattening process, it could be again used as a first substrate or as a second substrate. In the case where the porous Si remains, selective etching may be conducted using a mixed solution consisting of 49% hydrofluoric acid and 30% hydrogen peroxide solution while stirring. Thereafter, the first substrate may be subjected to surface treatment such as hydrogen annealing or surface polishing, so that the first substrate may be again used as a first substrate or as a second substrate.

EXAMPLE 5

A surface layer of a first single crystal Si substrate was anodized in an HF solution.

The anodization conditions are stated below.
Current density: 7 (mA·cm⁻²)
Anodization solution: $HF:H_2O:C_2H_5OH=1:1:1$
Period of time: 0.1 (min)
Thickness of porous Si: 0.1 (μm)

Then, anodization was conducted with a change of the concentration of the solution as stated below.
Current density: 7 (mA·cm⁻²)
Anodization solution: $HF:H_2O:C_2H_5OH=1:2:1$
Period of time: 1 (min)
Thickness of porous Si: 0.6 (μm)

As a result of observing the substrate through a scanning electron microscope, it has been recognized that a high porosity layer which corresponds to a second formation was formed in depth of about 0.1 μm from the surface.

The substrate was oxidized under an oxygen atmosphere at 400° C. for 1 hour. Through the oxidation, the inner walls of the respective holes in the porous Si were covered with thermal oxide films. The oxide film in the vicinity of the surface of the porous Si was removed by HF. After being inserted into an epitaxy device, the wafer was baked in a hydrogen atmosphere at 1040° C. for 5 minutes, thus burying the surface holes of the porous Si. A single crystal GaAs was epitaxially grown in a thickness of 0.5 μm on the porous Si where the surface holes were buried through the MOCVD (Metal Organic Chemical Vapor Deposition) method. The growth conditions are stated below.
Source gas: $TMG/AsH_3/H_2$
Gas pressure: 80 Torr
Temperature: 700° C.

After the surface of the GaAs layer and a surface of another Si substrate (second substrate) were superimposed one on another and brought in contact with each other, they were annealed at 700° C. for 1 hour, with the result that the bonding became firm.

As a result of separating the bonded wafers, they were divided at the high porosity layer in the vicinity of an interface of the low porosity layer side.

As a result of the above, a single crystal GaAs layer having a thickness of 0.5 μm could be formed on the second Si substrate. As a result of measuring a thickness of the single crystal GaAs layer as formed over the entire surface at 100 points, uniformity of the thickness was 0.5±0.01 μm, respectively.

Because the surface of the GaAs layer is rough, and also because there is a possibility that a residue of porous Si remains, surface touch polishing is conducted. As a result, a similar surface smoothness to that of the GaAs wafer normally on the market was obtained.

As a result of observing the section of the thin layer through a transmission electron microscope, it has been recognized that no new crystal defects were introduced in the Si layer, thereby maintaining excellent crystallinity.

As the second substrate, an Si substrate whose surface was oxidized can be used instead of the Si substrate. Also, after a deposited $SiO_2$ film is formed on the surface of the Si substrate or the GaAs layer, those substrates may be bonded to each other. In this case, the complete substrate is used as GaAs on an insulating substrate.

If the roughness remaining on the first substrate side is subjected to surface treatment such as hydrogen annealing or surface polishing to flatten the surface, the first substrate may be again used as a first substrate or as a second substrate. In the case where the porous Si remains, selective etching may be conducted using a mixed solution consisting of 49% hydrofluoric acid and 30% hydrogen peroxide solution while stirring. Thereafter, the first substrate may be subjected to surface treatment such as hydrogen annealing or surface polishing, so that the first substrate may be again used as a first substrate or as a second substrate.

EXAMPLE 6

A surface layer of a first single crystal Si substrate was anodized in an HF solution.

The anodization conditions are stated below.
Current density: 7 ($mA \cdot cm^{-2}$)
Anodization solution: $HF:H_2O:C_2H_5OH=1:1:1$
Period of time: 0.2 (min)
Thickness of porous Si layer: 0.2 ($\mu m$)
  Further,
Current density: 50 ($mA \cdot cm^{-2}$)
Anodization solution: $HF:H_2O:C_2H_5OH=1:1:1$
Period of time: 10 (sec)
Thickness of second porous Si layer: 0.2 ($\mu m$)

Through the anodization, the porosity of the porous Si layer was increased due to 50 ($mA \cdot cm^{-2}$), to thereby form a thin layer having a high porosity which is structurally fragile.

After being inserted into an epitaxy device, the wafer was baked in a hydrogen atmosphere at 1060° C. for 5 minutes. In this state, the sample was taken out and observed through a scanning electron microscope. It has been recognized that the surface holes of the porous Si were sealed. As a result, the outermost surface of the thin layer having a low porosity was, consumed, thereby burying the holes and being rendered non-porous. Sequentially, a single crystal Si was epitaxially grown in a thickness of 0.3 $\mu m$ on the porous Si through a CVD method. The growth conditions are stated below.
Source gas: $SiH_2Cl_2/H_2$
Gas flow rate: 0.2/180 l/min
Gas pressure: 760 Torr
Temperature: 1060° C.
Growth rate: 0.15 $\mu m$/min Further, an $SiO_2$ layer was formed in a thickness of 200 nm on the surface of the epitaxial Si layer by heat oxidation.

After the surface of the $SiO_2$ layer and a surface of another silica substrate (second substrate) were treated by $N_2$ plasma and washed with water, they were superimposed one on another and brought into contact with each other, and then they were annealed at 400° C. for 60 minutes, with the result that the bonding became firm.

As a result of separating the bonded wafers, they were divided at the high porosity layer in the vicinity of an interface on the side of the low porosity layer. Subsequently, the second substrate was located in a hydrogen atmosphere of 80 Torr, and then subjected to a heat treatment at 950° C. for 6 hours. As a result, the thin layer having a low porosity remaining on the second substrate was completely made non-porous. As a result of observing the section of the thin layer through an electron microscope, no residual cavities, etc., could be recognized. As a result of evaluating the surface roughness through an atomic force microscope, the mean square roughness in a region of 50 $\mu m$ square was about 0.4 nm, and the surface roughness was equivalent to that of the Si wafer normally on the market. Likewise, as a result of measuring the crystal defect density, the lamination defect density was $5 \times 10^3/cm^2$.

As a result of the above, a single crystal Si layer with low defect density could be formed on the Si oxide film of the second substrate. As a result of measuring a thickness of the single crystal Si layer as formed over the entire surface at 100 points, uniformity of the thickness was 412±9 nm.

Roughness remaining on the first substrate side may be subjected to surface treatment such as hydrogen annealing or surface polishing to flatten the surface, whereby it may be again used as a first substrate or as a second substrate. In the case where the porous Si remains, selective etching may be conducted using a mixed solution consisting of 49% hydrofluoric acid and 30% hydrogen peroxide solution while stirring. Thereafter, the first substrate may be subjected to surface treatment such as hydrogen annealing or surface polishing, so that the first substrate may be again used as a first substrate or as a second substrate.

EXAMPLE 7

A surface layer of a first single crystal Si substrate was anodized in an HF solution.

The anodization conditions are stated below.
Current density: 1 ($mA \cdot cm^{-2}$)
Anodization solution: $HF:H_2O:C_2H_5OH=1:1:1$
Period of time: 2 (min)
Thickness of porous Si: 0.4 ($\mu m$)
  Further,
Current density: 50 ($mA \cdot cm^{-2}$)
Anodization solution: $HF:H_2O:C_2H_5OH=1:1:1$
Period of time: 5 (sec)
Thickness of porous Si: 0.1 ($\mu m$)
  Still further, a third layer was manufactured.
Current density: 7 ($mA \cdot cm^{-2}$)
Anodization solution: $HF:H_2O:C_2H_5OH=1:1:1$
Period of time: 1 (min)
Thickness of porous Si: 1 ($\mu m$)

Through the anodization, porosity of the porous Si layer became large where the current density was set to 50 ($mA \cdot cm^{-2}$), whereby a high porosity layer which was structurally fragile was formed.

The substrate was oxidized at 400° C. for one hour in an oxygen atmosphere. Through this oxidation, the inner wall of the respective holes in the porous Si was covered with a thermal oxide film. After the wafer was inserted into a hydrogen bake device, it was baked at 1040° C. for 5 minutes, to thereby bury the surface holes of the porous Si. As a result, a portion in the vicinity of the surface of the thin layer having a low porosity (a layer formed with 1 $mA \cdot cm^{-2}$) was consumed, thereby burying the holes and being rendered non-porous. In other words, a non-porous single crystal layer with good quality was formed in a thickness of about 0.05 $\mu m$.

Further, an $SiO_2$ layer of 20 nm thickness was formed on the surface of the non-porous single crystal layer by thermal oxidation.

After the surface of the $SiO_2$ layer was superimposed on a surface of another Si substrate (second substrate) and brought into contact with the latter, the substrate was annealed at 1180° C. for 5 minutes, with the result that the bonding became firm.

As a result of separating the bonded wafers, they were divided at the high porosity layer in the vicinity of an interface on the side of the low porosity layer.

Subsequently, the substrate was placed in a hydrogen atmosphere under a pressure of 80 Torr, and subjected to a heat treatment at 1100° C. for 6 hours. As a result, the low porosity layer remaining on the surface of the second substrate was completely made non-porous and identified with the single crystal silicon layer. As a result of evaluating the surface roughness through an atomic force microscope, the mean square roughness in a region of 50 $\mu$m square was about 0.4 nm, and the surface roughness was equivalent to that of the Si wafer normally on the market.

As a result of the above, a single crystal Si layer of 400 nm thickness could be formed on the Si oxide film. As a result of measuring a thickness of the single crystal Si layer as formed over the entire surface at 100 points, a uniformity of the thickness was 403±8 nm.

As a result of observing the section of the layer through a transmission electron microscope, it has been recognized that no new crystal defects were introduced in the Si layer, thereby maintaining excellent crystallinity.

Roughness remaining on the first substrate side may be subjected to surface treatment such as hydrogen annealing or surface polishing to flatten the surface, whereby the first substrate may be again used as a first substrate or as a second substrate. In the case where the porous Si remains, selective etching may be conducted using a mixed solution consisting of 49% hydrofluoric acid and 30% hydrogen peroxide solution while stirring. Thereafter, the first substrate may be subjected to surface treatment such as hydrogen annealing or surface polishing, so that the first substrate may be again used as a first substrate or as a second substrate.

As shown in the figures, the methods according to the above-described respective Examples could be carried out on both surfaces of the first substrate.

In the respective Examples, in order to remove the porous Si layer remaining on the first substrate side after the bonded substrate has been separated, the selective etchant stated below may be used.

hydrofluoric acid;
hydrofluoric acid+hydrogen peroxide solution;
hydrofluoric acid+alcohol;
hydrofluoric acid+alcohol+hydrogen peroxide solution;
buffered hydrofluoric acid;
buffered hydrofluoric acid+hydrogen peroxide solution;
buffered hydrofluoric acid+alcohol;
buffered hydrofluoric acid+alcohol+hydrogen peroxide solution.

Also, when a normal Si etchant is used, selective etching is enabled to some degree, depending on the surface area of the porous Si.

According to the respective Examples, since the use of the selective etching process is not required, deterioration of film thickness uniformity due to excessive etching of the non-porous layer, which is caused when the selective ratio of etching is insufficient, is not common. Thus, the uniformity of the film transferred onto the second substrate is not deteriorated at all.

Also, according to the respective Examples, separation can be made over the overall surface of the wafer in the porous region at an interface between the high porosity layer and the low porosity layer, or the high porosity layer in the vicinity of the interface over the large area. Hence, after separation, the thin layer having a low porosity remaining on the second substrate side is merely smoothed so that the process of removing the residual layer of the porous layer through grinding, polishing, etching or the like can be shortened or omitted. Further, a thickness of the residual layer can be controlled according to the conditions of the porous layer structure formation. In particular, if a heat treatment is conducted, the residual thin layer having a low porosity is transformed into a non-porous layer without any cavities remaining in the interior of the layer, thereby being capable of smoothing the surface. Thus, the uniformity of the film thickness can be improved. This means that the wafer can be manufactured with good yield so as to satisfy a demand for a super-high uniformity.

Also, in the case where the first substrate after having been separated is again used as a first substrate in a subsequent cycle of manufacturing an SOI substrate, the first substrate can be reused many times until it cannot be used anymore.

Further, in the case where both layers which are in contact with the porous layer structure and the thin layer structure having a low porosity in the non-porous layer structure are formed of epitaxial layers, because the first substrate can be reused semi-permanently without any reduction in the thickness of the substrate even if it is used many times, it is very advantageous from the viewpoints of resource conservation and cost saving.

It has been known that defects are introduced into an epitaxial layer or its interface due to a difference in lattice constant caused by a difference of the hetelo-epitaxial material. Moreover, in case of double hetero-epitaxy, if one is a super-thin film in relation to the thickness of both the material, defects are liable to be introduced to the super-thin film. Hence, if a different kind of material is further allowed to epitaxially grow on the super-thin film epitaxial layer, defects are liable to be introduced into the super-thin film epitaxial layer. In this way, the interface is weakened due to a difference in lattice constant and defect introduction, so that the substrate peels off from that interface.

As described above, according to the present invention, even at the time of manufacturing a large-scaled integrated circuit of the SOI structure, there can be provided a method of manufacturing an inexpensive and high quality semiconductor substrate, which can be substituted for an expensive SOS or SIMOX.

What is claimed is:

1. A method of manufacturing a semiconductor substrate comprising the steps of:

preparing a first substrate having a porous region including at least two layers different in porosity and a non-porous layer formed on said porous region;

bonding a surface of said non-porous layer of said first substrate to a surface of a second substrate;

separating said first and second substrates from each other to transfer said non-porous layer to said second substrate; and removing the residual portion of the porous region remaining on a separation surface of said second substrate or making the residual portion non-porous to smooth said separation surface;

wherein the step of preparing said first substrate comprises a step of forming a first porous layer of 1 $\mu$m or less thickness, a second porous layer adjacent to said first porous layer and high in porosity, and said non-porous layer adjacent to said first porous layer.

2. A method of manufacturing a semiconductor substrate as claimed in claim 1, wherein the step of forming said non-porous layer comprises a step of making a surface side portion of said first porous layer non-porous, and/or a step of forming a non-porous layer on said first porous layer.

3. A method of manufacturing a semiconductor substrate as claimed in claim 1, wherein the step of forming said first porous layer comprises a step of making, after forming a porous layer, a surface side portion of said porous layer non-porous to make a remaining porous layer 1 $\mu$m or less in thickness.

4. A method of manufacturing a semiconductor substrate as claimed in claim 1, wherein said second porous layer is thickened more than said first porous layer.

5. A method of manufacturing a semiconductor substrate as claimed in claim 1 or 4, wherein after a second porous layer thinner than said first porous layer is formed, a surface side portion of said first porous layer is made non-porous to thin said first porous layer.

6. A method of manufacturing a semiconductor substrate as claimed in claim 1, further comprising a step of forming a third porous layer thicker and lower in porosity than said second porous layer on a side opposite to said first porous layer with respect to said second porous layer.

7. A method of manufacturing a semiconductor substrate as claimed in claim 1, wherein said separation surface smoothing step is conducted by a heat treatment in a non-oxidizing atmosphere without using anyone of selective etching and polishing.

8. A method of manufacturing a semiconductor substrate as claimed in claim 6, wherein said non-oxidizing atmosphere is hydrogen, an inert gas or a mixture atmosphere consisting of hydrogen and the inert gas.

9. A method of manufacturing a semiconductor substrate as claimed in claim 1, wherein the step of smoothing said separation surface is conducted by a heat treatment in vacuum without using any one of selective etching and polishing.

10. A method of manufacturing a semiconductor substrate as claimed in claim 1, wherein said porous region is made of single crystal.

11. A method of manufacturing a semiconductor substrate as claimed in claim 1, wherein said porous region is a single crystal Si layer.

12. A method of manufacturing a semiconductor substrate as claimed in claim 1, wherein said porous region is formed by anodizing said first substrate.

13. A method of manufacturing a semiconductor substrate as claimed in claim 12, wherein said first porous layer and said second porous layer are formed by anodization and selectively formed according to the kind and concentration of impurities in the first substrate, a current density, the composition and temperature of a chemical agent at the time of anodization or a combination thereof.

14. A method of manufacturing a semiconductor substrate as claimed in claim 1, wherein after the porous region is formed on one surface of the first substrate, said second porous layer is formed at an ion projection range position by ion implantation.

15. A method of manufacturing a semiconductor substrate as claimed in claim 1, wherein a side wall surface of pores in the porous region is oxidized to such a degree that a porous crystal structure remains in the interior of the side wall before the non-porous layer is formed.

16. A method of manufacturing a semiconductor substrate as claimed in claim 15, wherein an oxide film formed on the side wall of the pores in the surface of said porous region and in the vicinity of the surface thereof is removed before said non-porous layer is formed.

17. A method of manufacturing a semiconductor substrate as claimed in claim 1, wherein said non-porous layer includes a portion where the surface of said first porous layer is made non-porous by a heat treatment in a non-oxidizing atmosphere or in a vacuum.

18. A method of manufacturing a semiconductor substrate as claimed in claim 1, wherein said non-porous layer includes a portion where the surface of said first porous layer is made non-porous by a heat treatment in a non-oxidizing atmosphere or in a vacuum, and an oxide film formed on the surface of said non-porous layer.

19. A method of manufacturing a semiconductor substrate as claimed in claim 17 or 18, wherein said non-oxidizing atmosphere is hydrogen, an inert gas or a mixture gas atmosphere thereof.

20. A method of manufacturing a semiconductor substrate as claimed in claim 17 or 18, wherein said non-oxidizing atmosphere includes a small amount of Si.

21. A method of manufacturing a semiconductor substrate as claimed in claim 1, wherein said non-porous layer is formed by epitaxy on the basis of a crystal orientation of said first porous layer.

22. A method of manufacturing a semiconductor substrate as claimed in claim 1, wherein said non-porous layer consists of a single crystal layer formed by epitaxy on the basis of a crystal orientation of said first porous layer, and an oxide film layer formed above said single crystal layer.

23. A method of manufacturing a semiconductor substrate as claimed in claim 21 or 22, wherein said non-porous layer formed by epitaxy is a single crystal Si layer.

24. A method of manufacturing a semiconductor substrate as claimed in claim 21 or 22, wherein said non-porous layer formed by epitaxy has a single crystal compound semiconductor layer.

25. A method of manufacturing a semiconductor substrate as claimed in claim 1, wherein said non-porous layer consists of a plurality of layers different in electric conductive type or impurity concentration.

26. A method of manufacturing a semiconductor substrate as claimed in claim 1, wherein said first substrate after being separated is reused.

27. A method of manufacturing a semiconductor substrate as claimed in claim 26, wherein a pre-treatment for reusing consists of only a smoothing process.

28. A method of manufacturing a semiconductor substrate as claimed in claim 26, wherein a pre-treatment for reusing comprises a process of removing a residual portion of the porous region remaining after separation and a flattening process.

29. A method of manufacturing a semiconductor substrate as claimed in claim 1, wherein said separating step is conducted by any one of pressurizing, tension, shearing, wedge insertion, a heat treatment, oxidation, wave motion application and wire cutting or a combination thereof.

30. A method of manufacturing a semiconductor substrate as claimed in claim 1, wherein said second substrate is made of Si.

31. A method of manufacturing a semiconductor substrate as claimed in claim 1, wherein said second substrate is formed of an Si substrate, and an insulating film is formed on at least one of the surfaces to be bonded.

32. A method of manufacturing a semiconductor substrate as claimed in claim 1, wherein said second substrate is formed of a light transmissive substrate.

33. A method of manufacturing a semiconductor substrate as claimed in claim 1, wherein said first porous layer is of 0.5 $\mu$m or less in thickness.

34. A method of manufacturing a semiconductor substrate as claimed in claim 1, wherein said second porous layer has the highest porosity in the porous region.

35. A method of manufacturing a semiconductor substrate as claimed in claim 1, wherein said porous region consists of only two layers of the first porous layer and the second porous layer.

36. A method of manufacturing a semiconductor substrate as claimed in claim 1, wherein said second porous layer is of 1 $\mu$m or less in thickness.

37. A method of manufacturing a semiconductor substrate as claimed in claim 36, wherein said second porous layer is of 0.5 $\mu$m or less in thickness.

38. A method of manufacturing a semiconductor substrate as claimed in claim 1, wherein said porous region is of 2 $\mu$m or less in thickness.

39. A method of manufacturing a semiconductor substrate as claimed in claim 1, wherein in the step of forming said first porous layer, after a porous layer of 1 $\mu$m or less thickness is formed, a surface side portion of said porous layer is made non-porous to make the remaining porous layer 0.5 $\mu$m or less thickness.

40. A semiconductor substrate manufactured by a method of manufacturing a semiconductor substrate as claimed in claim 1.

41. A method of manufacturing a semiconductor article comprising the steps of:
preparing a first substrate having a porous region including at least two layers different in porosity and a non-porous layer formed on said porous region;
bonding a surface of said non-porous layer of said first substrate to a surface of a second substrate; and
separating said first and second substrates from each other to transfer said non-porous layer to said second substrate;
wherein the step of preparing said first substrate comprises a step of forming a first porous layer of 1 $\mu$m or less thickness, a second porous layer adjacent to said first porous layer and high in porosity, and said non-porous layer adjacent to said first porous layer.

42. A method of manufacturing a semiconductor article as claimed in claim 41, wherein the step of forming said non-porous layer comprises a step of making a surface side portion of said first porous layer non-porous, and/or a step of forming a non-porous layer on said first porous layer.

43. A method of manufacturing a semiconductor article as claimed in claim 41, wherein the step of forming said first porous layer comprises a step of making, after forming a porous layer, a surface side portion of said porous layer non-porous to make a remaining porous layer 1 $\mu$m or less in thickness.

44. A method of manufacturing a semiconductor article as claimed in claim 41, wherein said second porous layer is thickened more than said first porous layer.

45. A method of manufacturing a semiconductor article as claimed in claim 41 or 44, wherein after a second porous layer thinner than said first porous layer is formed, a surface side portion of said first porous layer is made non-porous to thin said first porous layer.

46. A method of manufacturing a semiconductor article as claimed in claim 41, further comprising a step of forming a third porous layer thicker and lower in porosity than said second porous layer on a side opposite to said first porous layer with respect to said second porous layer.

47. A method of manufacturing a semiconductor article as claimed in claim 41, further comprising a separation surface smoothing step conducted by a heat treatment in a non-oxidizing atmosphere without using any one of selective etching and polishing.

48. A method of manufacturing a semiconductor article as claimed in claim 46, wherein said non-oxidizing atmosphere is hydrogen, an inert gas or a mixture atmosphere consisting of hydrogen and the inert gas.

49. A method of manufacturing a semiconductor article as claimed in claim 41, further comprising a step of smoothing a separation surface conducted by a heat treatment in vacuum without using any one of selective etching and polishing.

50. A method of manufacturing a semiconductor article as claimed in claim 41, wherein said porous region is made of single crystal.

51. A method of manufacturing a semiconductor article as claimed in claim 41, wherein said porous region is a single crystal Si layer.

52. A method of manufacturing a semiconductor article as claimed in claim 41, wherein said porous region is formed by anodizing said first substrate.

53. A method of manufacturing a semiconductor article as claimed in claim 52, wherein said first porous layer and said second porous layer are formed by anodization and selectively formed according to the kind and concentration of impurities in the first substrate, a current density, the composition and temperature of a chemical agent at the time of anodization or a combination thereof.

54. A method of manufacturing a semiconductor article as claimed in claim 41, wherein after the porous region is formed on one surface of the first substrate, said second porous layer is formed at an ion projection range position by ion implantation.

55. A method of manufacturing a semiconductor article as claimed in claim 41, wherein a side wall surface of pores in the porous region is oxidized to such a degree that a porous crystal structure remains in the interior of the side wall before the non-porous layer is formed.

56. A method of manufacturing a semiconductor article as claimed in claim 55, wherein an oxide film formed on the side wall of the pores in the surface of said porous region and in the vicinity of the surface thereof is removed before said non-porous layer is formed.

57. A method of manufacturing a semiconductor article as claimed in claim 41, wherein said non-porous layer includes a portion where the surface of said first porous layer is made non-porous by a heat treatment in a non-oxidizing atmosphere or in a vacuum.

58. A method of manufacturing a semiconductor article as claimed in claim 41, wherein said non-porous layer includes a portion where the surface of said first porous layer is made non-porous by a heat treatment in a non-oxidizing atmosphere or in a vacuum, and an oxide film formed on the surface of said non-porous layer.

59. A method of manufacturing a semiconductor article as claimed in claim 57 or 58, wherein said non-oxidizing atmosphere is hydrogen, an inert gas or a mixture gas atmosphere thereof.

60. A method of manufacturing a semiconductor article as claimed in claim 57 or 58, wherein said non-oxidizing atmosphere includes a small amount of Si.

61. A method of manufacturing a semiconductor article as claimed in claim 41, wherein said non-porous layer is formed by epitaxy on the basis of a crystal orientation of said first porous layer.

62. A method of manufacturing a semiconductor article as claimed in claim 41, wherein said non-porous layer consists of a single crystal layer formed by epitaxy on the basis of a crystal orientation of said first porous layer, and an oxide film layer formed above said single crystal layer.

63. A method of manufacturing a semiconductor article as claimed in claim 61 or 62, wherein said non-porous layer formed by epitaxy is a single crystal Si layer.

64. A method of manufacturing a semiconductor article as claimed in claim 61 or 62, wherein said non-porous layer formed by epitaxy has a single crystal compound semiconductor layer.

65. A method of manufacturing a semiconductor article as claimed in claim 41, wherein said non-porous layer consists of a plurality of layers different in electric conductive type or impurity concentration.

66. A method of manufacturing a semiconductor article as claimed in claim 41, wherein said first substrate after being separated is reused.

67. A method of manufacturing a semiconductor article as claimed in claim 66, wherein a pre-treatment for reusing consists of only a smoothing process.

68. A method of manufacturing a semiconductor article as claimed in claim 66, wherein a pre-treatment for reusing comprises a process of removing a residual portion of the porous region remaining after separation and a flattening process.

69. A method of manufacturing a semiconductor article as claimed in claim 41, wherein said separating step is conducted by any one of pressurizing, tension, shearing, wedge insertion, a heat treatment, oxidation, wave motion application and wire cutting or a combination thereof.

70. A method of manufacturing a semiconductor article as claimed in claim 41, wherein said second substrate is made of Si.

71. A method of manufacturing a semiconductor article as claimed in clam 41, wherein said second substrate is formed on an Si substrate, and an insulating film is formed on at least one of the surfaces to be bonded.

72. A method of manufacturing a semiconductor article as claimed in claim 41, wherein said second substrate is formed of a light transmissive substrate.

73. A method of manufacturing a semiconductor article as claimed in claim 41, wherein said first porous layer is of 0.5 $\mu$m or less in thickness.

74. A method of manufacturing a semiconductor article as claimed in claim 41, wherein said second porous layer has the highest porosity in the porous region.

75. A method of manufacturing a semiconductor article as claimed in claim 41, wherein said porous region consists of only two layers of the first porous layer and the second porous layer.

76. A method of manufacturing a semiconductor article as claimed in claim 41, wherein said second porous layer is of 1 $\mu$m or less in thickness.

77. A method of manufacturing a semiconductor article as claimed in claim 76, wherein said second porous layer is of 0.5 $\mu$m or less in thickness.

78. A method of manufacturing a semiconductor article as claimed in claim 41, wherein said porous region is of 2 $\mu$m or less in thickness.

79. A method of manufacturing a semiconductor article as claimed in claim 41, wherein in the step of forming said first porous layer, after a porous layer of 1 $\mu$m or less thickness is formed, a surface side portion of said porous layer is made non-porous to make the remaining porous layer 0.5 $\mu$m or less thickness.

80. A semiconductor article manufactured by a method of manufacturing a semiconductor article as claimed in claim 41.

81. A method of manufacturing a semiconductor article as claimed in clam 41, further comprising a step of smoothing a separation surface of the second substrate.

82. A method of manufacturing a semiconductor article as claimed in claim 81, wherein the smoothing step comprises a step of removing the residual portion of the porous region, and/or a step of making the residual portion of the porous region non-porous.

* * * * *

UNITED STATES PATENT AND TRADEMARK OFFICE
CERTIFICATE OF CORRECTION

PATENT NO. : 6,143,628
DATED : November 7, 2000
INVENTOR(S) : Nobuhiko Sato, et al.

Page 1 of 2

It is certified that error appears in the above-identified patent and that said Letters Patent is hereby corrected as shown below:

Title page,
Item [56] References Cited, under OTHER PUBLICATIONS after "A. Uhlir," "Electolytic" should read -- Electrolytic --.

Column 2,
Line 15, "Fully" should read -- Full --.

Column 3,
Line 3, "sever" should read -- severe --;
Line 4, "wafer more." should read -- wafer. --;
Line 15, "Si" should read -- a Si --;
Line 24, "causes the" should read -- causes --.

Column 4,
Line 41, "strength together." should read -- strength. --.

Column 6,
Line 49, "Si" should read -- Si, --;
Line 50, "Si," should read -- Si --.

Column 7,
Line 27, "remaining" should be deleted.

Column 9,
Line 16, "substarate" should read -- substrate --;
Line 23, "in above," should read -- above, --.

Column 12,
Line 43, "of the" should read -- the --.

Column 13,
Line 46, "epitxial" should read -- epitaxial --.

Column 14,
Line 31, "ning processing" should read -- ing processing --.

Column 17,
Line 14, "x($\mu$m)" should read -- X($\mu$m) --;
Line 59, "methods" should read -- method --.

UNITED STATES PATENT AND TRADEMARK OFFICE
CERTIFICATE OF CORRECTION

PATENT NO.   : 6,143,628
DATED        : November 7, 2000
INVENTOR(S)  : Nobuhiko Sato, et al.

It is certified that error appears in the above-identified patent and that said Letters Patent is hereby corrected as shown below:

Column 22,
Line 33, "in depth" should read -- in a depth --.

Column 23,
Line 46, "was," should read -- was --.

Column 26,
Line 31, "hetelo-epitaxial" should read -- hetero-epitaxial --.

Column 27,
Line 28, "anyone" should read -- any one --.

Signed and Sealed this

Sixteenth Day of October, 2001

*Attest:*

NICHOLAS P. GODICI
*Attesting Officer*     Acting Director of the United States Patent and Trademark Office